(12) United States Patent
Dorrough

(10) Patent No.: US 10,261,208 B2
(45) Date of Patent: Apr. 16, 2019

(54) APPARATUS AND METHODS FOR DETECTING OBSCURED FEATURES

(71) Applicant: David M. Dorrough, Eagle, ID (US)

(72) Inventor: David M. Dorrough, Eagle, ID (US)

( * ) Notice: Subject to any disclaimer, the term of this patent is extended or adjusted under 35 U.S.C. 154(b) by 131 days.

(21) Appl. No.: 15/136,570

(22) Filed: Apr. 22, 2016

(65) Prior Publication Data

US 2016/0377758 A1 Dec. 29, 2016

Related U.S. Application Data

(60) Provisional application No. 62/183,189, filed on Jun. 23, 2015.

(51) Int. Cl.
*G01R 27/26* (2006.01)
*G01V 3/08* (2006.01)
*G01V 3/15* (2006.01)

(52) U.S. Cl.
CPC ........... *G01V 3/08* (2013.01); *G01R 27/2605* (2013.01); *G01V 3/15* (2013.01)

(58) Field of Classification Search
CPC .. G01R 27/26; G01R 27/221; G01R 27/2605; G01V 3/08; G01V 3/15; G01V 3/088; G01N 27/22; G01N 27/221
See application file for complete search history.

(56) References Cited

U.S. PATENT DOCUMENTS

| | | | |
|---|---|---|---|
| 4,177,421 A | * | 12/1979 | Thornburg ........... G01D 5/2412 307/116 |
| 5,247,261 A | | 9/1993 | Gershenfeld |
| RE34,741 E | | 9/1994 | Andermo |
| 5,900,550 A | | 5/1999 | Menzel |
| 6,198,271 B1 | | 3/2001 | Heger et al. |
| 6,215,293 B1 | | 4/2001 | Yim |
| 7,504,817 B2 | | 3/2009 | Sanoner et al. |

(Continued)

FOREIGN PATENT DOCUMENTS

| | | |
|---|---|---|
| DE | 3600446 A1 | 7/1987 |
| DE | 102004007314 A1 | 8/2005 |

(Continued)

OTHER PUBLICATIONS

International Search Report and Written Opinion dated Sep. 8, 2017 for PCT/US2017/040901.

(Continued)

*Primary Examiner* — Minh N Tang
(74) *Attorney, Agent, or Firm* — Stoel Rives LLP; R. Whitney Johnson

(57) ABSTRACT

Obscured feature detectors and methods of detecting obscured features are disclosed. An obscured feature detector can include a plurality of sensor plates. Each of the sensor plates can have an equivalent primary sensing field zone and a capacitance that varies based on the dielectric constant of the materials that compose the surrounding objects and the proximity of those objects. A sensing circuit is coupled to the sensor plates to measure the capacitances of the sensor plates. A controller is coupled to the sensing circuit to analyze the capacitances measured by the sensing circuit. One or a plurality of indicators are coupled to the controller, and can be selectively set to identify a location of an obscured feature behind a surface.

36 Claims, 18 Drawing Sheets

(56) References Cited

U.S. PATENT DOCUMENTS

| | | | |
|---|---|---|---|
| 8,669,772 B2* | 3/2014 | Dorrough | G01R 27/26 324/663 |
| 8,836,347 B2 | 9/2014 | Dorrough | |
| 2003/0201783 A1 | 10/2003 | Steber et al. | |
| 2005/0194959 A1 | 9/2005 | Miller | |
| 2008/0238403 A1 | 10/2008 | Sanoner et al. | |
| 2011/0215822 A1 | 9/2011 | Dorrough | |
| 2011/0309572 A1 | 12/2011 | Miyamoto | |
| 2012/0212241 A1 | 8/2012 | Wallace et al. | |
| 2016/0377758 A1 | 12/2016 | Dorrough | |

FOREIGN PATENT DOCUMENTS

| | | |
|---|---|---|
| DE | 202007002776 U1 | 6/2007 |
| DE | 102008054447 A1 | 6/2010 |
| EP | 0506605 A1 | 9/1992 |
| EP | 0952465 A2 | 10/1999 |
| EP | 2196828 A1 | 6/2010 |
| WO | 2007051780 A1 | 5/2007 |
| WO | 2007141062 A1 | 12/2007 |
| WO | 2009111518 A1 | 9/2009 |
| WO | 2010066659 A2 | 6/2010 |
| WO | 2011138084 A1 | 11/2011 |

OTHER PUBLICATIONS

International Search Report and Written Opinion for PCT/US2017/040857, dated Sep. 14, 2017.

Kapazitäten mit einem Sigma-Delta-Wandler messen (Measuring capacitance with a sigma-delta converter), Michal Brychta and Paul Löser, in "elektronik industrie 3—2005".

"Evaluation of Methods for Ground Bounce Removal in GPR Utility Mapping", Sigve Tjora, Egil Eide, Tenth International Conference on Ground Penetration Radar, Jun. 21-24, 2004, Delft, The Netherlands.

Non-final Office Action dated Mar. 30, 2018 for U.S. Appl. No. 15/406,322.

* cited by examiner

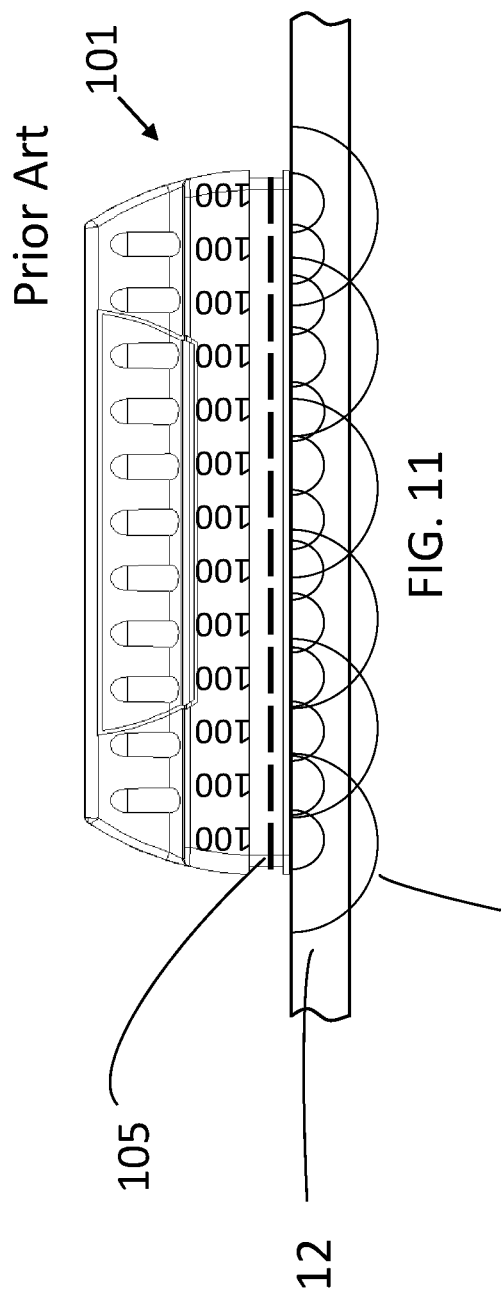
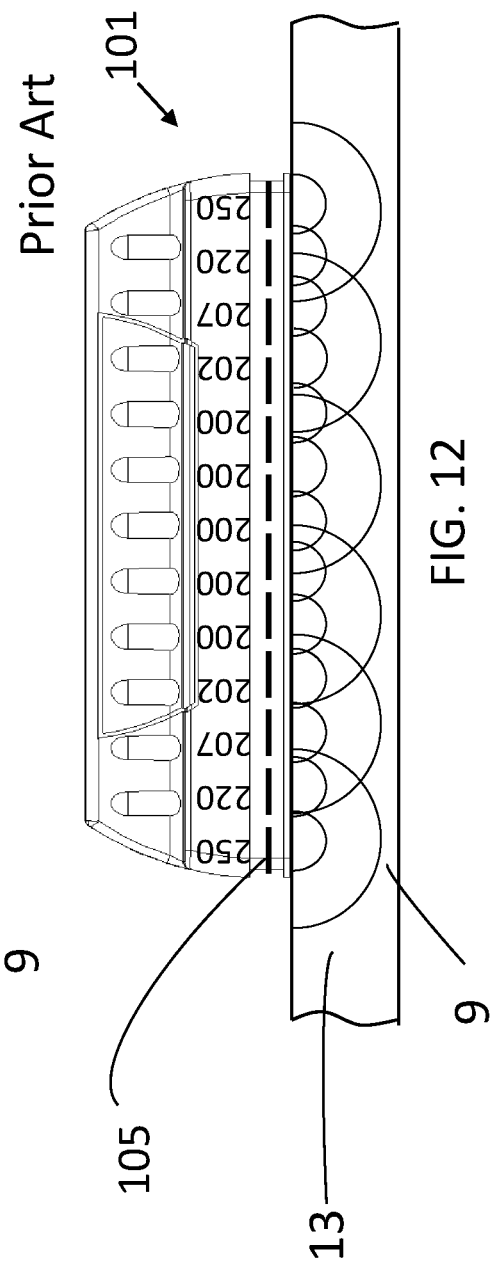
FIG. 11
FIG. 12

APPARATUS AND METHODS FOR DETECTING OBSCURED FEATURES

RELATED APPLICATIONS

This application claims the benefit under 35 U.S.C. § 119(e) of U.S. Provisional Patent Application No. 62/183,189, titled "Obscured Feature Detector with Advanced Sensor Plate Configuration," filed Jun. 23, 2015, which is hereby incorporated by reference herein in its entirety.

TECHNICAL FIELD

The present disclosure relates generally to devices to detect a presence of obscured features behind opaque, solid surfaces, and more specifically to devices to locate beams and studs behind walls and joists beneath floors.

BACKGROUND

Locating obscured features such as beams, studs, joists and other elements behind walls and beneath floors is a common problem encountered during construction, repair and home improvement activities. For example, often a desire arises to cut or drill into a wall, floor, or other supported surface with the aim of creating an opening in the surface while avoiding the underlying support elements. In these instances, knowing where the support elements are positioned before beginning can be desirable so as to avoid cutting or drilling into the support elements. On other occasions, one may desire to anchor a heavy object such as a picture or shelf to a support element obscured by a supported surface. In these cases, it is often desirable to install a fastener through the supported surface in alignment with an underlying support element. However, with the wall, floor or supported surface in place, the location of the support element is not visually detectable.

A variety of rudimentary techniques have been employed in the past with limited success to address the problem of locating underlying features obscured by an overlying surface. These techniques include driving small pilot nails through various locations in the overlying surface until an underlying support element is encountered and then covering over holes in the surface that did not reveal the location of the underlying support element. A less destructive technique comprises tapping on the overlying surface with the aim of detecting audible changes in the sound which emanates from the surface when there is a support element beneath or behind the area of the surface being tapped. This technique is ineffective, however, because the accuracy of the results depends greatly on the judgment and skill of the person tapping and listening to search for the underlying support element, and because the sound emitted by the tapping is heavily influenced by the type and density of the surface being examined.

Magnetic detectors have also been employed to find obscured support elements with the detector relying on the presence of metallic fasteners, such as nails or screws, in the wall and support element to trigger a response in the detector. However, since metallic fasteners are spaced at discrete locations along the length of a support, a magnetic detector may pass over a length of the support where no fasteners are located, thereby failing to detect the presence of the obscured support element.

Electronic sensors have also been employed to detect obscured features behind opaque surfaces. These detectors sense changes in capacitance on the examined surface that result from the presence of features positioned behind, beneath or within the surface. These changes in capacitance are detectable through a variety of surfaces such as wood, sheet-rock, plaster and gypsum and do not rely on the presence of metal fasteners in the surface or obscured feature for activation of the sensor. However, conventional electronic detectors may suffer from a significant shortcoming. Conventional obscured feature detectors may have difficulty accurately compensating for the thickness and density of the detected surface, which negatively impact accuracy.

SUMMARY

The present disclosure advantageously addresses one or more of the aforementioned deficiencies in the field of obscured feature detection by providing an accurate, simple to use and inexpensively manufactured obscured feature detector. The detector can be employed by placing the device against the examined surface and reading the location of all features present beneath the surface where the device is positioned. The detector is able to accurately read through different surface materials and different surface thicknesses.

Additional aspects and advantages will be apparent from the following detailed description of preferred embodiments, which proceeds with reference to the accompanying drawings.

BRIEF DESCRIPTION OF THE DRAWINGS

FIG. 11 is a prior art obscured feature detector placed on a comparatively thinner surface.

FIG. 12 is a prior art obscured feature detector placed on a comparatively thicker surface.

In the following description, reference is made to the accompanying drawings that form a part thereof, and in which is shown by way of illustration specific exemplary embodiments in which the invention may be practiced. These embodiments are described in sufficient detail to enable those skilled in the art to practice the technology and embodiments described herein, and it is to be understood that modifications to the various disclosed embodiments may be made, and other embodiments may be utilized, without departing from the spirit and scope of the present disclosure. The following detailed description is, therefore, not to be taken in a limiting sense.

DETAILED DESCRIPTION

Many presently available stud finders (e.g., obscured feature detectors) use capacitance to detect obscured features behind a surface. Capacitance is an electrical measure of an object's ability to hold or store charge. A common form of an energy storage device is the parallel plate capacitor whose capacitance is approximated by: $C = \varepsilon_r \varepsilon_0 A/d$, where A is the overlapping area of the parallel plates, d is the distance between the plates, $\varepsilon_r$ is the relative static permittivity (or dielectric constant of the material between the plates), and $\varepsilon_0$ is a constant. A dielectric material is an electrical insulator that can be polarized by applying an electric field. When a dielectric is placed in an electric field, the molecules shift from their average equilibrium positions causing dielectric polarizations. Because of dielectric polarizations, positive charges are shifted toward the negative edge of the field, and negative charges shift in the opposite direction.

The dielectric constant ($\varepsilon_r$) of air is one, while most solid non-conductive materials have a dielectric constant greater than one. Generally, it is the variations in the dielectric constants of non-conductive solids that enable conventional capacitive sensors to work.

In their most rudimentary form, capacitive sensors are in part single-plate capacitive sensors. These single-plate capacitive sensors use the environment surrounding them as the dielectric. In practice the field line circles back around the sensor plates and couples with an opposite pole in the detector. However, for the sake of product design, the second plate may often be assumed to be infinitely far away.

When the sensor plates are placed on a wall at a location with no support behind the wall, the detector measures the capacitance of the wall and the air behind it. When placed in a position having a support behind the wall, the detector then measures the capacitance of the wall and the support, which has a higher dielectric constant than air. As a consequence, the detector registers an increase in capacitance which can then be used to trigger an indicating system.

Figure 14:
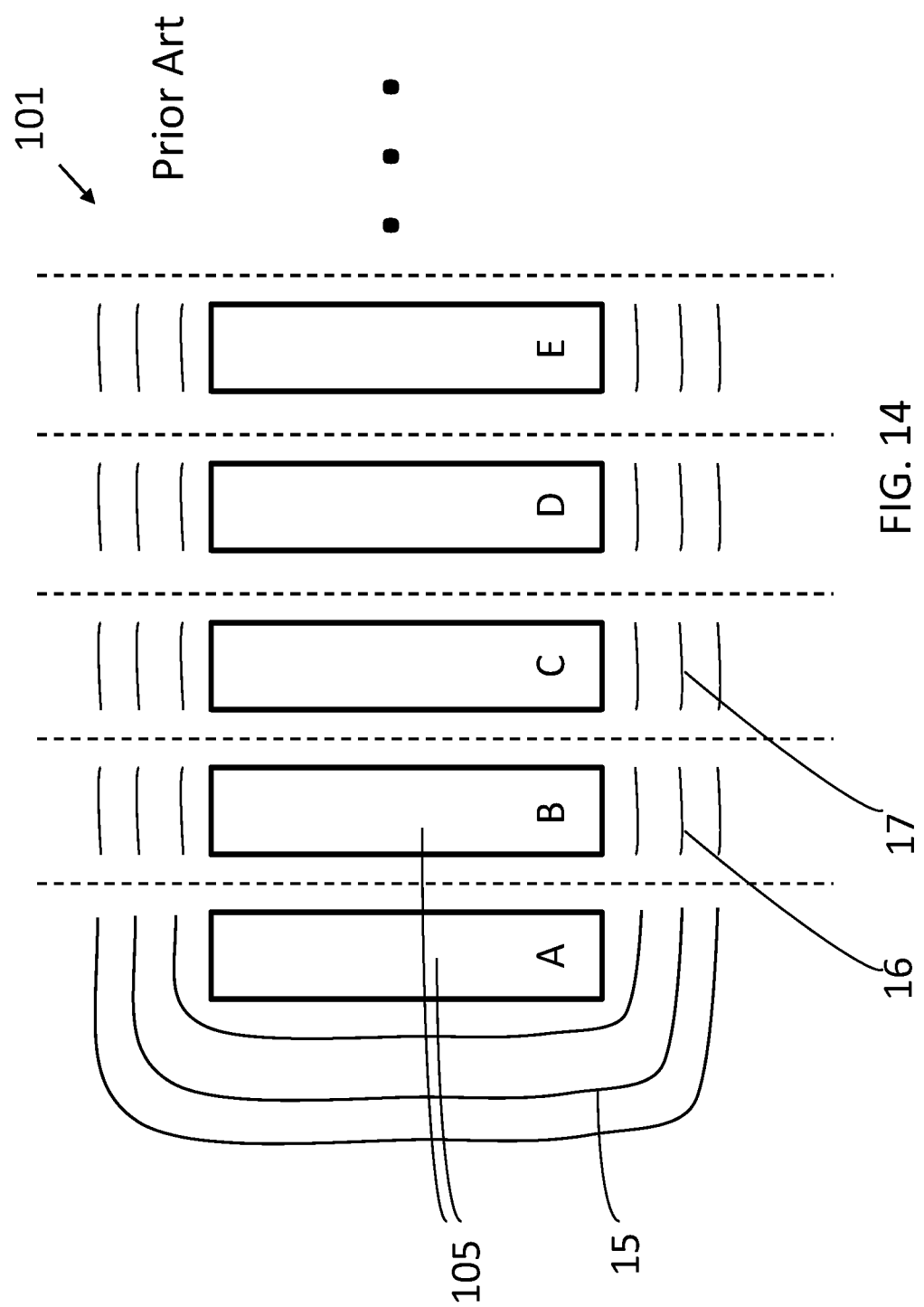
FIG. 14 shows an elevation view of a bottom surface of a prior art obscured feature detector, illustrating the primary sensing field zones for several sensor plates.

In presently available obscured feature detectors a set of identical sensor plates are typically arranged in a linear fashion (see, e.g., FIG. 14). Each of the sensor plates performs a sensor reading of the surface. The sensor readings are then compared. The sensor plates that have the highest sensor readings are interpreted to be the locations of obscured features. However, sensor plates that are near the ends of the group may not respond to obscured features in the same manner as the plates that are near the center. This issue may be particularly evident when the obscured feature detector is moved from a thinner, or less dense, surface to a thicker, or more dense, surface.

Ideally each of the sensor plates on a thicker surface would have similar sensor readings to each other, because the sensor plates are all on the same surface, with no obscured features present. However, the sensor readings of the sensor plates near the ends may see a larger reading increase than the sensor plates near the center. The sensor plates that are at the ends are alone in creating the electric fields that are beyond the group of sensor plates. As a result, the sensor plates near the end may respond with a disproportionately higher reading when placed on a thicker surface. Accordingly, the controller may have difficulty determining if the elevated sensor readings are due to the presence of an obscured feature, or due to the detector being placed on a thicker surface. This disclosure provides a solution.

In obscured feature detectors with multiple sensor plates it is desirable for each sensor plate to have a similar response to the same obscured feature. To ensure a similar response from each sensor plate, proper geometric shape and arrangement of the sensor plates can ensure an equivalent response to an obscured feature. Improved shielding of sensor plate traces may also improve performance. In addition, enhanced electrical coupling of the user to the sensing circuit may provide improved performance. Also a mechanism to ensure that the sensor plates are flat against the surface may improve performance.

The present disclosure is directed to obscured feature detectors and methods of detecting obscured feature detectors. In the exemplary embodiments, an obscured feature detector comprises a group of sensor plates, a multi-layer printed circuit board (PCB), a sensing circuit, a controller, a display circuit, a power controller, and/or a housing.

The disclosed embodiments enable more accurate identification of a location of an obscured feature. The disclosed embodiments can also instantly and accurately read through a variety of surfaces with different dielectric constants. In addition the presently disclosed embodiments improve ability to instantly and accurately read through a variety of surface thicknesses.

The disclosed embodiments also create a detector that is easier to use. Many prior art detectors require more steps, and more time and more proficiency, in order to recalibrate the unit to different surfaces to determine the locations of obscured features. The disclosed embodiments provide more reliable sensor readings. The sensor readings from the sensor plates self-adjust to the detected surface and provide a more reliable reading and have the ability to detect features more deeply. The sensor readings have significantly less surface-thickness-induced reading error. With this reading error removed, The disclosed embodiments can detect objects more deeply.

The present disclosure will now be described more fully with reference to the accompanying drawings. This disclosure may, however, be embodied in many different forms and should not be construed as limited to the embodiments set forth herein; rather, these embodiments are provided by way of illustration only so that this disclosure will be thorough, and fully convey the full scope to those skilled in the art.

Figure 1:
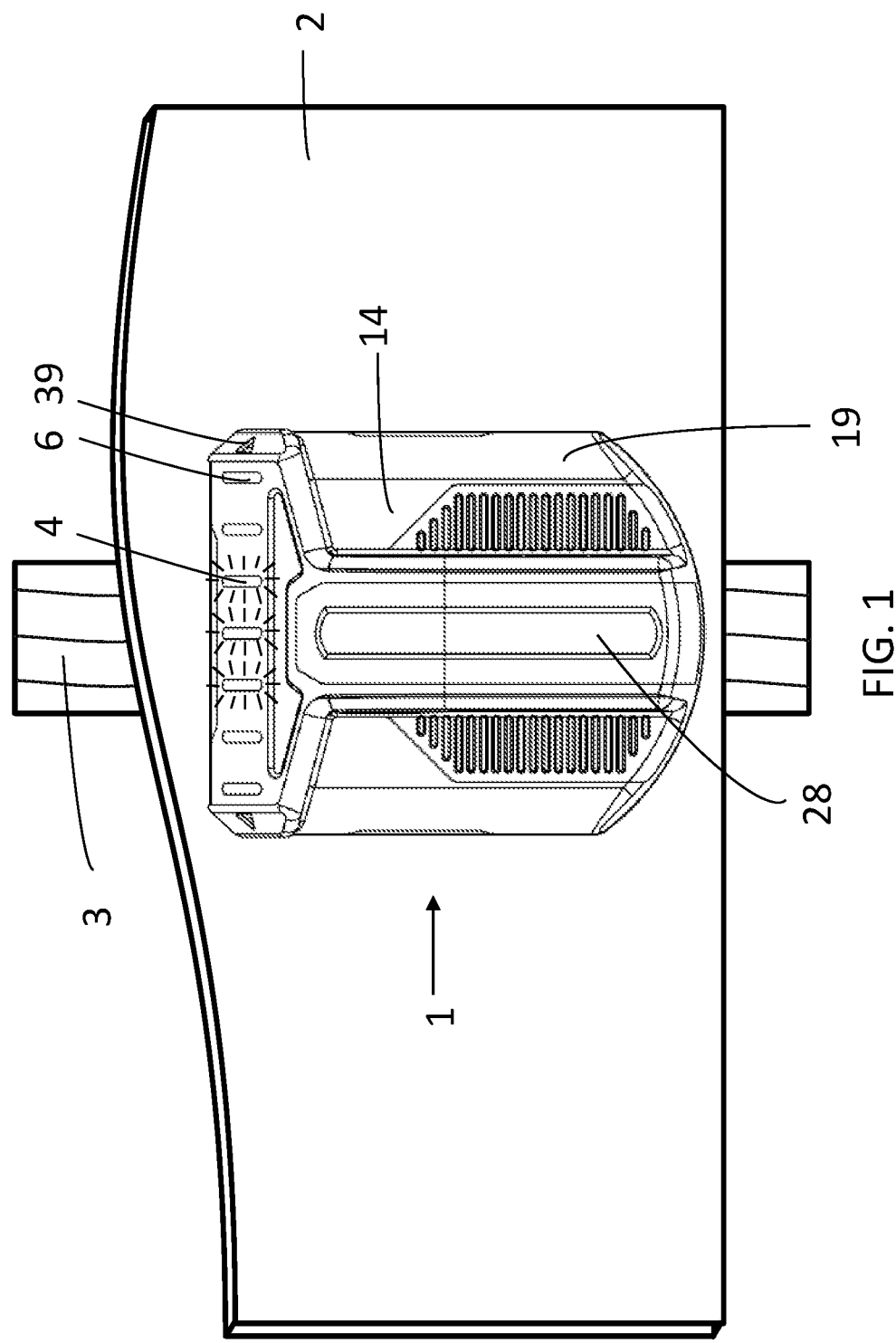
FIG. 1 illustrates an advanced obscured feature detector, according to one embodiment, placed on a piece of sheet-rock and detecting an obscured feature.
Figure 2:
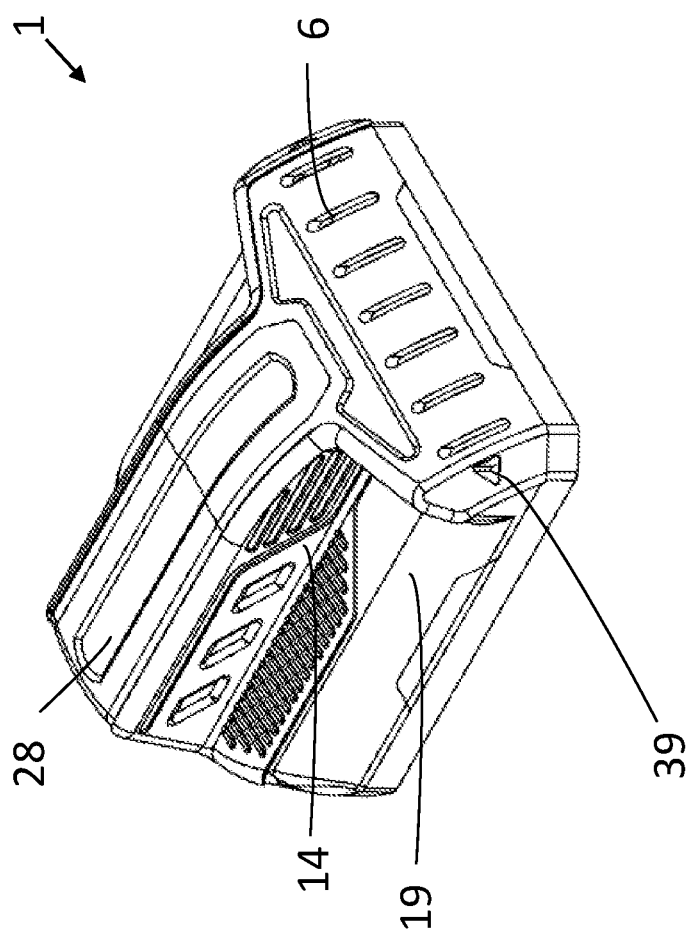
FIG. 2 is a perspective view of the obscured feature detector of FIG. 1.
Figure 3:
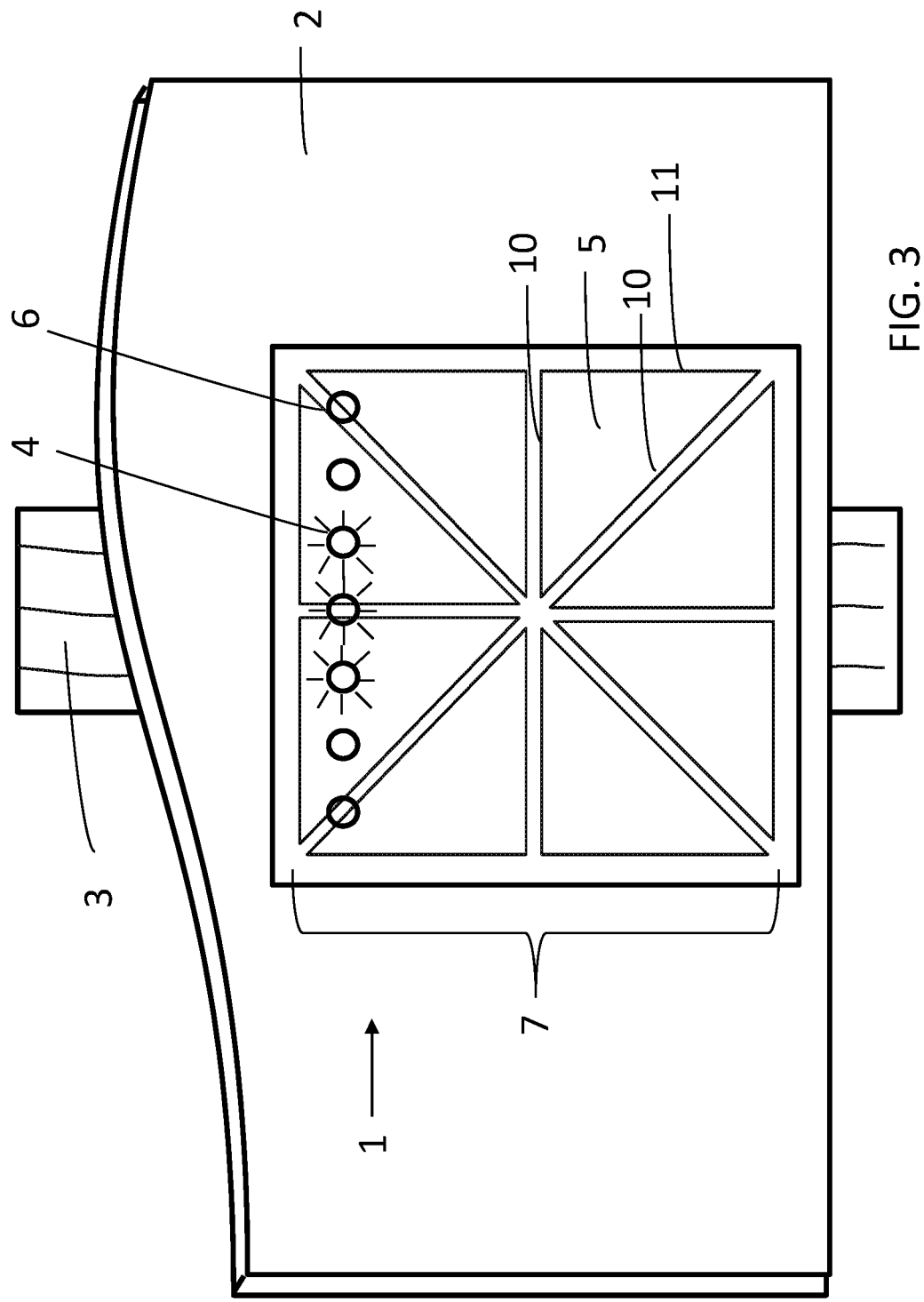
FIG. 3 is an illustrative drawing that shows sensor plates and activated indicators of the obscured feature detector of FIG. 1, with the activated indicators signaling a position of the hidden obscured feature 3.

FIG. 1 illustrates an obscured feature detector 1, according to one embodiment, placed on a piece of sheetrock 2 (or similar surface) and detecting an obscured feature 3. FIG. 2 is a perspective view of the obscured feature detector 1 of FIG. 1. FIG. 3 shows a sensor side of the obscured feature detector 1, which includes a plurality of sensor plates 5.

With reference to FIGS. 1-3, generally and collectively, the obscured feature detector 1 includes three or more sensor plates 5, a sensing circuit (see FIG. 4), one or more indicators 6, one or more proximity indicators 39, and a housing 19 to provide or otherwise accommodate a handle 14, an active shield plate 23 (see FIG. 7), and a battery cover 28.

The three or more sensor plates 5 each can take a sensor reading that varies based on a proximity of the sensor plate 5 to one or more surrounding objects and on a material property of each of the one or more surrounding objects. The three or more sensor plates 5 collectively create a sensing field. Each individual sensor plate 5 of the three or more sensor plates 5 creates a corresponding primary sensing field zone that may be a geometric three-dimensional volume within the sensing field where the individual sensor plate 5 contributes more strongly to the sensing field than any other of the three or more sensor plates 5. The three or more sensor plates 5 all create primary sensing field zones that are geometrically similar. The sensing circuit couples to the three or more sensor plates 5 to measure the sensor readings of the three or more sensor plates 5.

In some embodiments each sensor plate 5 may be part of a group 7 of sensor plates 5. Each group 7 may include two or more sensor plates 5 and may also include an active shield plate 23. The sensor plates 5 and active shield plate 23 may be on different planes. Nevertheless if they are driven simultaneously, in some embodiments, they may be part of the same group 7 of sensor plates 5. Each sensor plate 5 has a geometry that is defined by its shape. Each sensor plate 5 also has a perimeter. In some embodiments the perimeter may be composed of multiple segments. In some embodiments each segment of the perimeter is either an internal border 10, or an external border 11. In some embodiments, if a sensor plate 5 has a segment of the perimeter that is adjacent to the perimeter of the group 7, then said segment comprises an external border 11. In some embodiments, if a sensor plate 5 has a segment of the perimeter that is not adjacent to the perimeter of the group 7, then said segment comprises an internal border 10.

In some embodiments to sense the location of an obscured feature 3, a sensor plate 5 may be driven with a current source, and the obscured feature detector 1 measures the time it takes for the sensor plate 5 to reach a certain threshold voltage, thereby achieving a sensor reading. In other embodiments a charge-share mechanism is used to achieve a sensor reading. In other embodiments a radio frequency signal is placed on the sensor plates 5 to achieve a sensor reading. In each of these embodiments a signal is driven on the sensor plate(s) 5 to be sensed.

In some embodiments, only a single sensor plate 5 may be driven at a time. In these embodiments the single sensor plate 5 may be alone in creating the sensing field.

In some embodiments, a group 7 of sensor plates 5 may all be driven with the same signal simultaneously. In these embodiments the group 7 of sensor plates 5 may create the sensing field. In some embodiments multiple sensor plates 5 may be driven simultaneously each with the same signal, although possibly only a single sensor plate 5 may be sensed. Advantageously driving multiple sensor plates 5 simultaneously may create field lines that go deeper into an obscured surface than may be possible if only a single sensor plate 5 is driven. Deeper field lines may make it possible to sense more deeply. In some embodiments a group 7 of sensor plates 5 and an active shield plate 23 may all be driven with the same signal simultaneously, which together would create the sensing field.

Each sensor plate 5 has a primary sensing field zone. In some embodiments the primary sensing field zone is a geometric three-dimensional volume of the sensing field and associated field lines where the individual sensor plate 5 is able to sense more strongly than the active shield plate 23 (if present), or any other sensor plate 5. In some embodiments it is desirable for each sensor plate 5 to have similar primary sensing field zones. In some embodiments it is desirable for each sensor plate 5 to have primary sensing field zones that are geometrically similar and to have similar sensing fields within their respective primary sensing field zones.

FIG. 3 illustrates a group 7 of eight sensor plates 5. Each of the eight sensor plates 5 is triangular. Each triangular sensor plate 5 has two segments that each have internal borders 10. Each sensor plate 5 also has one segment that has an external border 11.

In some embodiments, as shown in FIG. 3, the group 7 may comprise eight triangular sensor plates 5 that each have a similar geometry. The group 7 of sensor plates 5 may be arranged within a square area, wherein each side of the square area is approximately 3 inches long. In some embodiments, each of the sensor plates 5 may be in the shape of an isosceles triangle. In some embodiments the sensor plates 5 may be arranged such that the hypotenuse of two triangular sensor plates 5 may be adjacent to each other, as shown in FIG. 3. In some embodiments two sensor plates 5 with adjacent hypotenuses may approximate a square and fit within one quadrant of the group 7 of sensor plates 5. In some embodiments there may be two such triangles positioned in each quadrant such that the entire group 7 comprises eight sensor plates 5, as shown in FIG. 3. In some embodiments the distance between adjacent sensor plates 5 may be approximately 2.0 mm.

In FIG. 3 a sensing field may be created collectively by the eight sensor plates 5. In some embodiments an active shield plate 23 may contribute to the sensing field. In the embodiment of FIG. 3 each of the sensor plates 5 may have similar primary sensing field zones. In this embodiment, the radial symmetry of the sensor plates 5 may provide each sensor plate 5 with primary sensing zones that are geometrically similar. Likewise, each of the sensor plates 5 may also have similar sensing fields within their respective primary sensing field zones. As a result, an obscured feature detector 1 that is built with a configuration of FIG. 3 may offer improved performance. When the obscured feature detector 1 is moved from a thin surface to a thicker surface the sensor readings for each of the sensor plates 5 may have a similar increase in value.

In some embodiments a sawtooth-shape border or perimeter may have the same effective border as a straight-line border that does not have a sawtooth. In some embodiments a border with a very slight curve may have the same effective border as a straight-line border that does not have a slight curve. In some embodiments a sensor plate 5 with a slot in it has the same effective geometry as an otherwise equivalent sensor plate 5 without a slot. In some embodiments a sensor plate 5 with a small hole in it may have the same effective geometry as an equivalent sensor plate 5 without a hole. Many other geometries are possible that may be effectively equivalent to other substantially equivalent geometries. Many other borders are possible that may effectively be equivalent to other substantially equivalent borders. If a geometry or a border has a property that is effectively equivalent to another geometry or border, then the two may be considered to be similar.

In some embodiments a group 7 of sensor plates 5 is configured such that each sensor plate 5 in the group 7 has the same geometry. In some embodiments each of the sensor plates 5 in the group 7 is radially symmetrical.

The plurality of indicators 6 may be toggled between a deactivated state and an activated state to indicate a location within the sensing field of a region of relative high sensor reading. Activated indicators 4 can indicate the position of the obscured feature 3. Proximity indicators 39 can indicate that the obscured feature detector 1 may be near the obscured feature 3.

In FIGS. 1-3, the indicators 6 are positioned on a layer above the sensor plates 5. In some embodiments there may be an active shield plate 23 between the sensor plates 5 and the indicators 6 so that the indicators 6 do not interfere with the function of the sensor plates 5. In some embodiments it may be desirable to position the indicators 6 on a layer above the sensor plates 5 so that each of the sensor plates 5 may have a similar distance from the sensor plate 5 to the edge of a corresponding PCB.

In some embodiments, a layer of protective material is mounted to the bottom of the obscured feature detector 1, such that there is a layer of protective material between the surface 2 and the obscured feature detector 1. In some embodiments, the protective material has the interior substantially filled such that it is substantially free from cavities. In some embodiments the protective material is unlike felt, Velcro, cloth, or other materials that have an interior with cavities. The layer of protective material may serve the purpose of protecting the bottom of the obscured feature detector 1 from damage due to knocks, bumps, and wear-and-tear. The protective material could be made from a solid piece of material, such as plastic or other solid non-conductive materials. A solid layer of plastic may provide a low friction surface that would allow the obscured feature detector 1 to slide across the wall. Although some embodiments of the obscured feature detector 1 do not require sliding to operate, a low friction surface may be useful to some users that may choose to move the obscured feature detector 1 from position to position by sliding it.

The protective layer of plastic may be mounted with a pressure sensitive adhesive, glue, or other means. The layer of protective material may be a complete layer that covers the entire surface; it may be rectangular strips, round pieces, or other layers of plastic with other geometries.

A protective material that is substantially filled such that it is substantially free from cavities may build up less static charge than prior art solutions and may advantageously provide for more consistent sensor readings.

In some embodiments the protective material is UHMW-PE (Ultra-HighMolecular Weight Polyethylene). UHMW-PE has a low coefficient of friction. UHMW-PE also absorbs very little moisture which may provide increased immunity from changes in humidity, and may provide enhanced immunity from changes in humidity.

Figure 4:
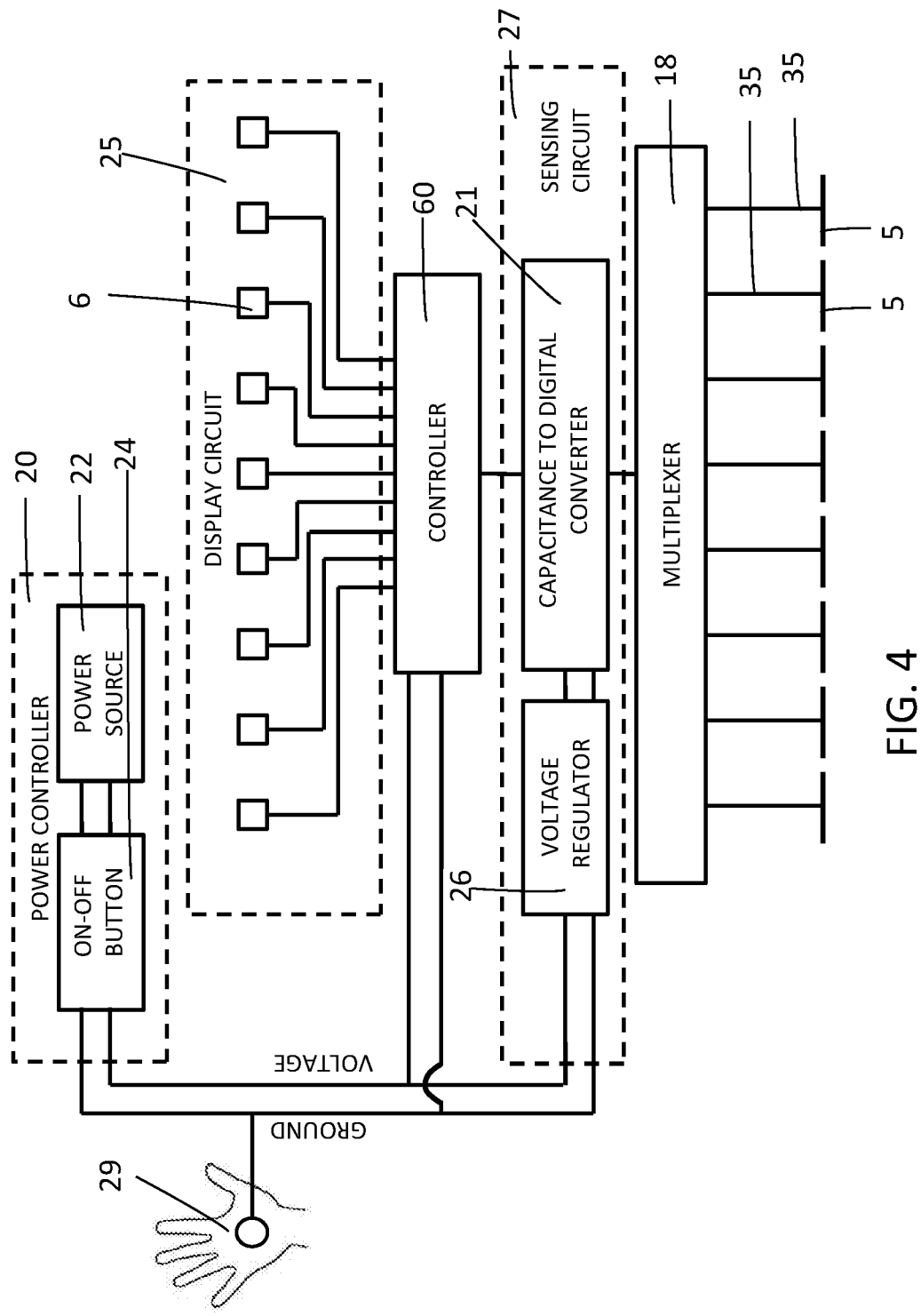
FIG. 4 is a diagram of a circuit of an obscured feature detector, according to one embodiment.

FIG. 4 is a diagram of a circuit of an obscured feature detector 1, according to one embodiment. The circuit includes a multiplexer 18, a power controller 20, a display circuit 25, a sensing circuit 27, and a controller 60.

The power controller 20 may include a power source 22 and an on-off button 24. The power source 22 can comprise an energy source for powering the indicators 6 and supplying power to a capacitance-to-digital converter 21, and a controller 60. In some embodiments, the power source 22 can comprise a DC battery supply. The on-off switch 24 can be used to activate the controller 60 and other components of the obscured feature detector 1. In some embodiments, the on-off switch 24 comprises a push-button mechanism that activates components of the obscured feature detector 1 for a selected time period. In some embodiments the push button activates the components such that the components remain activated until the button is released. In some embodiments the on-off switch 24 comprises a capacitive sensor that can sense the presence of a finger or thumb over the button. In some embodiments, the on-off switch 24 can comprise a toggle switch, or other types of buttons or switches.

The display circuit 25 may include one or more indicators 6 that are electronically coupled to the controller 60.

The sensing circuit 27 may include a voltage regulator 26 and the capacitance-to-digital converter 21. In some embodiments, as shown in FIG. 4, the sensing circuit 27 comprises a plurality of sensors, the voltage regulator 26, and the capacitance-to-digital converter 21. The voltage regulator 26 may be used to condition the output of the power controller 20, as desired. In some embodiments the voltage regulator 26 is placed as near as possible to the capacitance-to-digital converter 21, which may provide a better power source 22 to the capacitance-to-digital converter 21. The sensing circuit 27 can be electrically coupled to the controller 60. One or more sensor plate traces 35, or electrically conductive paths on the PCB, may connect the individual sensor plates 5 to the capacitance-to-digital converter 21. The connection of the sensor plates 5 to the capacitance-to-digital converter 21 may be made via the multiplexer 18. The multiplexer 18 can individually connect the sensor plates 5 to the capacitance-to-digital converter 21.

In some embodiments the multiplexer 18 may connect a single sensor plate 5 to the sensing circuit 27. In some embodiments, the multiplexer 18 may connect more than one adjacent sensor plate 5 to the sensing circuit 27. In some embodiments, the multiplexer 18 may connect more than one non-adjacent sensor plate 5 to the sensing circuit 27. In some embodiments, the multiplexer 18 is configured so that the sensing circuit 27 measures the capacitance of one sensor plate 5. In some embodiments, the multiplexer 18 is configured so that the sensing circuit 27 measures the aggregate capacitance of two or more sensor plates 5.

Each individual sensor plate 5 of a group 7 can be independently connected to the capacitance-to-digital converter 21 via the multiplexer 18. In some embodiments, the group 7 itself is comprised of layers of copper on a PCB.

Figure 8:
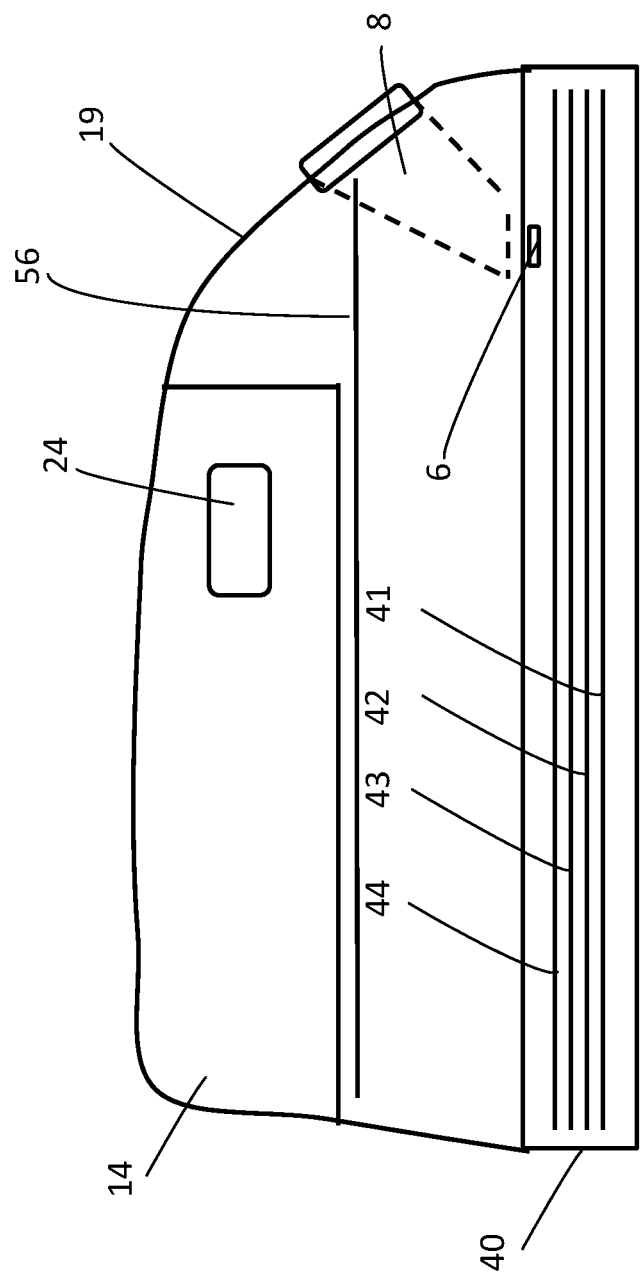
FIG. 8 is a cross-sectional view of an obscured feature detector, according to one embodiment, including a housing, with light pipes and a button, and a printed circuit board.
Figure 18:
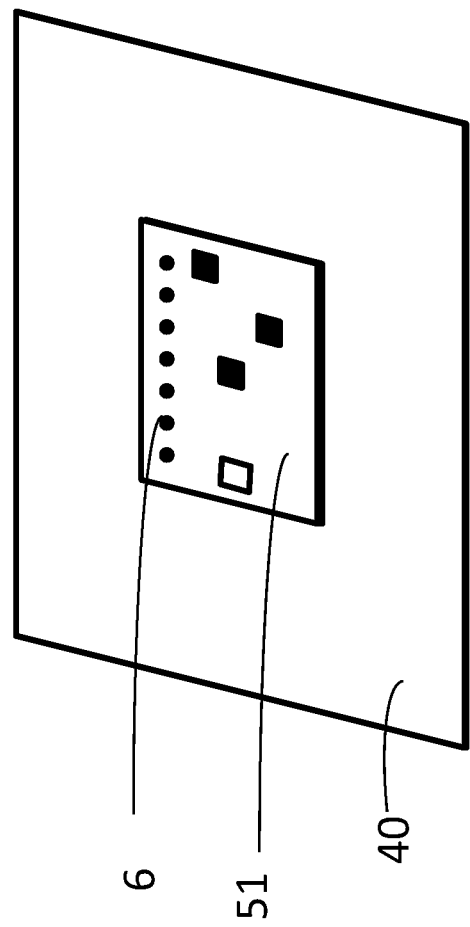
FIG. 18 illustrates two different printed circuit boards in a stacked configuration.

In some embodiments a two-layer PCB is configured as a sensor plate board 40 (see FIGS. 8 and 18). In some embodiments a first layer of the sensor plate board 40 comprises the sensor plates 5, and a second layer of the sensor plate board 40 comprises a shield. In some embodiments, the shield is comprised of a layer of copper that covers the entire surface of the second layer of the PCB. In some embodiments the layer of copper is covered with a non-conductive layer of soldermask. In some embodiments there are holes in the layer of soldermask. In some embodiments, the holes in the layer of soldermask comprise solder pads that are suitable for making solder bonds.

In some embodiments a four-layer PCB is configured as an interconnection board that has interconnections suitable for connecting circuitry components. In some embodiments the interconnection board is configured with four layers of interconnections that are suitable for interconnecting the sensing circuit 27, the controller 60, and the display circuit 25. In some embodiments one side of the PCB is configured for mounting components, and a second side of the PCB is configured with solder pads.

In some embodiments the sensor plates 5 are arranged on a first PCB. In some embodiments the interconnection circuitry is arranged on a second PCB. In some embodiments the first PCB is bonded to the second PCB.

In some embodiments there are solder pads on the sensor plate board 40 that are complementary with solder pads on an interconnection board. In some embodiments the sensor plate board 40 and the interconnection board 51 may be stacked on top of one another and bonded to each other (e.g., FIG. 18). In some embodiments the bonding agent that bonds the two PCBs together may be solder. In some embodiments solder paste may be used to bond two PCBs together. In some embodiments, they may be bonded together with solder and the process to bond them together may be standard SMT (surface mount technology) processes. The standard SMT process may include using a stencil to place solder paste in the desired locations. The SMT process may include placing one PCB on top of another. In some embodiments pins may be used to ensure proper alignment of the two PCBs. In some embodiments the final step of the SMT process may involve running the stacked PCBs through a reflow oven (e.g., FIG. 18 illustrates an interconnection board 51 stacked on top of a sensor plate board 40).

In some embodiments the sensor plates 5, shield, and circuitry are placed on a single PCB. In some embodiments a six-layer PCB is used. In some embodiments the bottom layer, which is the sixth layer, of the PCB is configured with sensor plates 5. The fifth layer may be an active shield. The top four layers may connect the balance of the circuitry.

In some embodiments the sensor plates 5, shield, and circuitry are placed on a single PCB. In some embodiments a four-layer PCB is used. First and second layers of the PCB are configured with interconnection circuitry. In some embodiments the bottom layer, which is the fourth layer, of the PCB is configured with sensor plates 5. The third layer may be an active shield.

The PCB can be made from a variety of suitable materials, such as, for example, FR-4, FR-406, or more advanced materials used in radio frequency circuits, such as Rogers 4003C. Rogers 4003C, and other radio-frequency-class PCB substrates, may offer improved performance across a broader temperature and humidity range.

As used herein, the term "module" can describe any given unit of functionality that can perform in accordance with one or more embodiments of the present invention. For example, a module might by implemented using any form of hardware or software, or a combination thereof, such as, for example, one or more processors, controllers 60, ASICs, PLAs, logical components, software routines, or other mechanisms.

Different processes of reading a capacitance and converting it to a digital value, also known as a capacitance-to-digital conversion, are well-described in the prior art. The many different methods are not described here, and the reader is referred to the prior art for details about different capacitance-to-digital converter methods. Some embodiments use a sigma-delta capacitance-to-digital converter, such as the one that is built into the Analog Devices AD7747 integrated circuit. Some embodiments use a charge-sharing method of capacitance-to-digital conversion.

In some embodiments the voltage regulator 26 may comprise the ADP150-2.65 from Analog Devices, or the NCP702 from ON Semiconductor, which provide very low noise. In some embodiments, the controller 60 may comprise the C8051F317 from Silicon Laboratories, or any of many other microcontrollers.

Detecting obscured features 3 can require a high degree of accuracy, and may require more accuracy than a capacitance-to-digital converter 21 may be able to provide, if the native capacitance-to-digital converter sensor readings are used alone. Native sensor readings are the raw values read from the capacitance-to-digital converter 21; they are the digital output of the capacitance-to-digital converter 21.

Some embodiments perform native reads multiple times, and combine the results of the multiple native reads, to create a reading. Some embodiments perform native reads multiple times, and combine the results of the multiple native reads, using a different configuration for two or more of the native reads to create a reading. Some embodiments perform native reads multiple times, and sum or average the results of the multiple native reads, to create a reading. In some embodiments this improves the signal-to-noise ratio. Each native read may involve reading one sensor plate 5. A native read could also involve reading a plurality of sensor plates 5, if multiple sensor plates 5 are multiplexed to the capacitance-to-digital converter 21. In some embodiments multiple native reads are combined to create a reading.

Summing or averaging multiple native reads may improve the signal-to-noise ratio, but may not reduce the effect of non-linearities in the capacitance-to-digital converter 21. The ideal capacitance-to-digital converter 21 is perfectly linear, which means that its native sensor readings increase in direct proportion to an increase in the capacitance being sensed. However, many capacitance-to-digital converters 21 may not be completely linear, such that a change in the input capacitance does not result in an exactly proportional increase in the native reading. These non-linearities may be small, but when a high degree of accuracy is desired it may be desirable to implement methods that reduce the effects of the non-linearities.

In some embodiments, the ill effects of the non-linearities may be mitigated by summing multiple native reads, using a slightly different configuration for each of the native reads. Some embodiments perform native reads using two or more different configurations.

For example, the bias current is one parameter that can be altered to create different configurations. The bias current could be set to normal, or normal +20%, normal +35%, or normal +50%. Different bias currents produce different native sensor readings, even if all other factors remain constant. Since each native reading has a different value, presumably each native reading may be subject to different non-linearities. Presumably summing or averaging sensor readings that are subject to different non-linearities may cause the non-linearities to partially cancel each other out, instead of being summed, or multiplied.

In some embodiments there are two separate and independent capacitance-to-digital converters 21. In some embodiments each of them may have different non-linearities. Using both of the capacitance-to-digital converters 21, using a first converter for some of the reads and using the second converter for some of the reads, may mitigate the effect of any single non-linearity.

Some embodiments perform native reads on each of the sensor plates 5 using each of twelve different configurations.

After completing the sensor readings, in some embodiments, two different calibration algorithms may be performed: first an individual-plate calibration that adjusts for individual sensor plate 5 variations, and second a surface material calibration that adjusts the sensor readings so that they are tuned to the surface density/thickness. Other embodiments may only use one of the two calibration algorithms. Some embodiments may use other calibration algorithms. In some embodiments the calibration algorithms are performed by a calibration module.

In some embodiments, individual plate calibration is employed first. With individual plate calibration, each sensor plate 5 may have its own individual calibration value. In some embodiments, after the sensor readings are taken, an individual plate calibration value is added to, or subtracted from, each of the sensor readings. Other embodiments may use multiplication, division, or other mathematical functions to perform the individual plate calibration. In some embodiments, the individual plate calibration value is stored in non-volatile memory. Individual plate calibration compensates for individual sensor plate 5 irregularities, and is used to compensate for these irregularities. In some embodiments it is presumed that after performing individual plate calibration that the sensor readings will presumably have the same calibrated values, if the sensor plate sensor readings are taken while the obscured feature detector 1 is on the surface 2 that is similar to the surface 2 the obscured feature detector 1 was calibrated on. For example, if sensor readings are performed on ½" sheetrock 2, without any obscured features 3 present, and the individual calibration values were created for ½" sheetrock 2, then after performing individual plate calibration, it is presumed that all the sensor readings would be corrected to a common value. If sensor readings are performed on a thicker material (such as ⅝" sheetrock 2), a thinner material (such as ⅜" sheetrock 2), or a different material (such as ¾" plywood) then there may be some error in the values. Surface material calibration may help correct this error.

In some embodiments surface material calibration may be used.

In some embodiments, after calibrating the sensor plate sensor readings the obscured feature detector 1 decides if an obscured feature 3 is present. In some embodiments the lowest sensor plate reading is subtracted from the highest sensor plate reading. If the difference is greater than a threshold value then a determination is made that an obscured feature 3 is present.

If it is determined that no obscured features 3 are present, then all of the indicators 6 may be deactivated. If an obscured feature 3 is present then the obscured feature detector 1 begins the process of determining the position(s) and width(s) of the obscured feature(s) 3.

In some embodiments pattern matching may be employed to determine which LEDs to activate. In some embodiments a pattern matching module is used to determine the locations of obscured features 3. The pattern matching module compares the calibrated and scaled sensor readings from the sensor plates 5 to several predetermined patterns. The pattern matching module determines which predetermined pattern best matches the sensor readings. Then the set of indicators 6 that corresponds to the best matching pattern is activated. Additional details about pattern matching are discussed in the prior art, such as in U.S. Pat. No. 8,884,633. Those details will not be repeated here; instead the reader is encouraged to refer to them directly.

In some embodiments the obscured feature detector 1 comprises a single capacitance-to-digital converter 21. In some embodiments the sensor plates 5 may be individually connected to the capacitance-to-digital converter 21. In some embodiments the sensor plates 5 may be individually connected to the capacitance-to-digital converter 21 via the multiplexer 18. In some embodiments more than one sensor plate 5 may be connected to the capacitance-to-digital converter 21 at a time. In some embodiments multiple adjacent sensor plates 5 may be electrically connected to the capacitance-to-digital converter 21. In some embodiments multiple non-adjacent sensor plates 5 may be connected to the capacitance-to-digital converter 21. The use of the multiplexer 18 to connect sensor plates 5 to a single capacitance-to-digital converter 21 may improve sensor plate 5 to sensor plate 5 consistency of the sensor readings, because the sensor readings from each of the sensor plates 5 may be equally affected by variations to the capacitance-to-digital converter 21. Factors that may affect the sensor readings from the capacitance-to-digital converter 21 may include, but are not limited to, process variations, temperature variations, voltage variations, electrical noise, aging, and others.

In some embodiments, the sensor plate traces 35 are routed such that each of the sensor plate traces 35 has substantially equal capacitance, resistance, and inductance. In some embodiments it is desirable for each of the sensor plate traces 35 to have the same electrical properties, so that each of the sensor plates 5 will respond equivalently to the same detected object(s).

Figure 6:
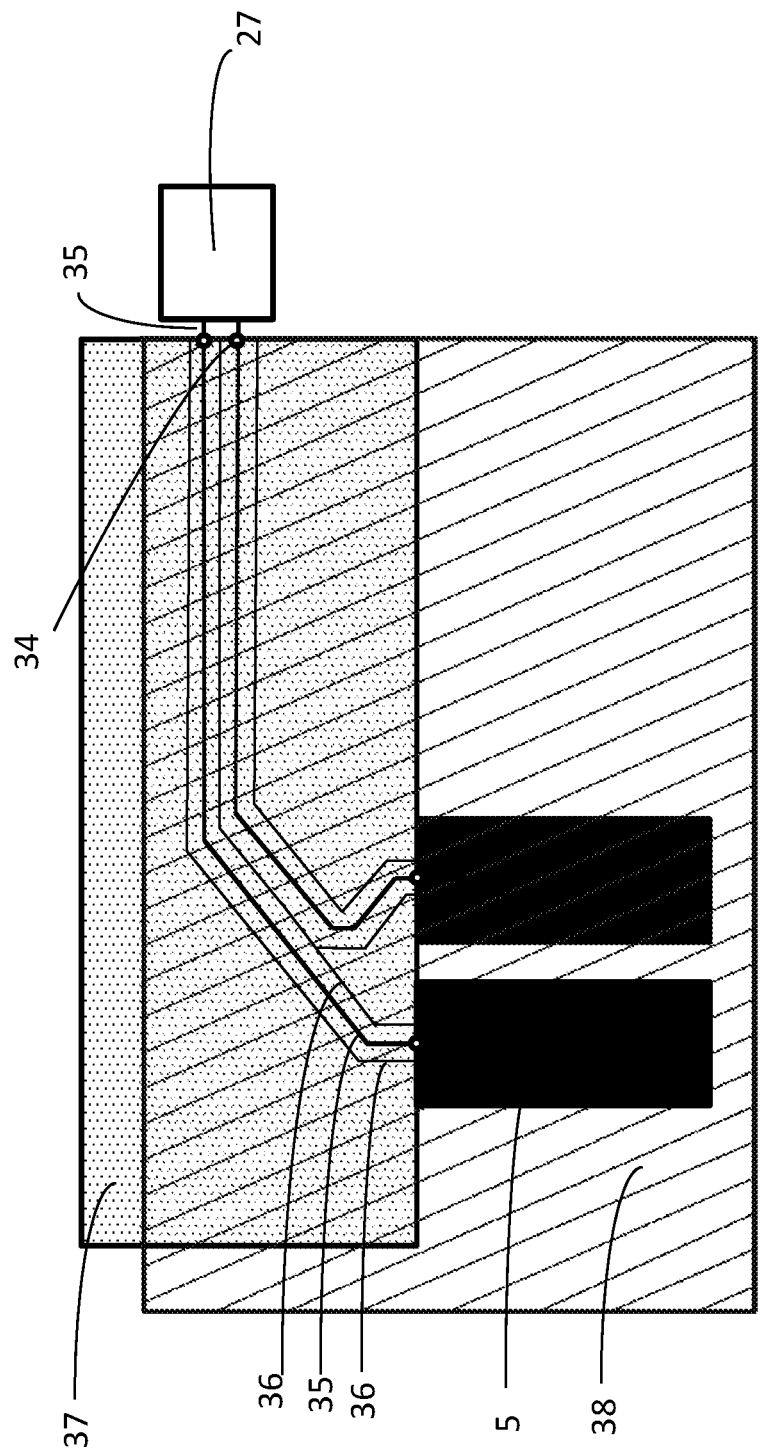
FIG. 6 illustrates a routing of sensor plate traces of an obscured feature detector, according to one embodiment. In the illustrated embodiment, each of the sensor plate traces has substantially similar trace length and the traces are surrounded by an active shield.

In some embodiments each of the sensor plate traces 35 from the capacitance-to-digital converter 21 to each of the sensor plates 5 has substantially the same length (see, e.g., FIG. 6). In some embodiments two or more of the sensor plate traces 35 from the capacitance-to-digital converter 21 to the sensor plates 5 have substantially the same length. In some embodiments sensor plate traces 35 with substantially the same length may have more equivalent capacitances, inductances, and resistances. Equal length sensor plate traces 35 may offer enhanced performance because they may improve the uniformity of the sensor readings, such that the sensor plates 5 respond more equivalently to the same detected objects, and may provide more immunity from environmental conditions, such as temperature and humidity.

In some embodiments each of the sensor plate traces 35, which comprises electrically conductive paths, has substantially the same width. In some embodiments, both the width and the length of each of the sensor plate traces 35 are substantially equivalent. In some embodiments the sensor plate traces 35 will have more than one segment. For example, a first segment of the traces may route the sensor plate traces 35 from a capacitance-to-digital converter 21 to a via. The via may take the sensor plate trace 35 to a different layer of the PCB, where there may be a second segment of the sensor plate trace 35. In some embodiments all of the sensor plate traces 35 will have the same length and width, in each segment, as the other traces in that segment. In some embodiments two or more of the sensor plate traces 35 will have the same width throughout a first segment. In some embodiments two or more of the sensor plate traces 35 will have the same width throughout a second segment. In some embodiments two or more of the sensor plate traces 35 will have the same length throughout a first segment. In some embodiments two or more of the sensor plate traces 35 will have the same length throughout a second segment.

In some embodiments the sensor plate traces 35 comprise multiple segments. In some embodiments a segment of a sensor plate trace 35 may be the wire bonds that are within the package of an integrated circuit that route the signals from the piece of silicon to the pins of the integrated circuit package. In some embodiments a segment of a sensor plate trace 35 may comprise a layer of copper on a first layer of a PCB. In some embodiments a segment of a sensor plate trace 35 may comprise a layer of copper on a second layer of a PCB.

In some embodiments the capacitance-to-digital converter 21 will read the sum of the capacitance on the sensor plates 5 and the capacitance on the sensor plate traces 35. In some embodiments, only detecting the sensor readings on the sensor plates 5, and not detecting the sensor plate traces 35, may be preferable. However, because the sensor plates 5 and sensor plate traces 35 are electrically coupled, a means of ensuring stable and uniform capacitance on the sensor plate traces 35 may be desired. For example, it may be desirable to configure the sensor plate traces 35 so that their capacitance is uniform and stable. Consequently, it may be preferred for the sensor plate traces 35 to be configured so that the sensor plate traces 35 do not change. In some embodiments it may be preferred that the sensor plate traces 35 do not change relative to each other, such that any change in the capacitance on one sensor plate trace 35 is reflected in each of the sensor plate traces 35.

In some embodiments it may be advantageous to shield the sensor plate traces 35. Sensor plate trace shielding may protect the sensor plate traces 35 from external electromagnetic fields. In some embodiments shielding the sensor plate traces 35 may also advantageously provide a more consistent environment for the sensor plate traces 35 by helping to ensure that each of the sensor plate traces 35 has an environment that is similar to each of the other sensor plate traces 35.

In some embodiments each of the sensor plate traces 35 from the capacitance-to-digital converter 21 to each of the sensor plates 5 has substantially the same surroundings. In some embodiments the sensor plate traces 35 are routed sufficiently far apart so that capacitive and inductive coupling between the sensor plate traces 35 is minimized, and may improve consistency because each of the sensor plate traces 35 may have surroundings that are more similar to the other sensor plate traces 35. In some embodiments each of the sensor plate traces 35 is shielded on one or both sides with an active shield trace (see, e.g., FIG. 6).

In some embodiments a user 29 may be electrically coupled to the sensing circuit 27. In some embodiments the quality of the sensor readings is increased when an electrically conductive point of the sensing circuit 27 is coupled to the user 29. Electrically coupling the user 29 to the sensing circuit 27 may provide a stationary voltage level for the sensing circuit 27 and may result in higher quality sensor readings that have higher sensitivity. For example, a prior art obscured feature detector that drives the sensor plates 5 with a 3.0V may in reality only drive the sensor plates 5 with a 3.0V signal relative to ground. However, if the ground is floating, then driving the sensor plates 5 with 3.0V could result in a 1.5V signal on the sensor plates 5, and a −1.5V signal on the ground.

In some embodiments electrically coupling the user 29 to the sensing circuit 27 may result in higher absolute voltage swings on the sensor plates 5, which may be due in part to the sensing circuit 27 being held at a stable level. In some embodiments electrically coupling the user 29 to the sensing circuit 27 may also result in sensor readings that are more consistent.

In some embodiments the user 29 is electrically coupled to the ground of the sensing circuit 27, as shown in FIG. 4. In some embodiments the user 29 is electrically coupled to the voltage source of the sensing circuit 27. In some embodiments the user 29 is electrically coupled to a different electrically conductive point of sensing circuit 27.

In some embodiments the hand of the user 29 may be electrically coupled to the sensing circuit 27 by making direct contact with the sensing circuit 27. In some embodiments an electrically conductive material, such as a wire, may electrically couple the hand of the user 29 to the sensing circuit 27. In some embodiments the button, which the user 29 would need to touch to activate the obscured feature detector 1, may comprise an electrically conductive material which may be electrically coupled to the sensing circuit 27. In some embodiments the button may comprise aluminum or another electrically conductive material such as tin-plated steel. In some embodiments an aluminum button may be anodized, which may provide pleasing cosmetics.

In some embodiments the housing 19 (see FIG. 2) of the obscured feature detector 1 may comprise an electrically conductive material, such as an electrically conductive plastic. In some embodiments only a portion of the housing 19 may comprise electrically conductive plastic. The electrically conductive housing, or a portion of the electrically conductive housing may be coupled to an electrically conductive point in the sensing circuit 27, thereby coupling the user 29 to the sensing circuit 27.

In some embodiments mixing carbon black with the plastic resin may provide electrically conductive properties. Many thermoplastics, including polypropylene and polyethylene, become electrically conductive when a carbon black is mixed into the plastic resin. In some embodiments the conductivity increases as the concentration of carbon black is increased, advantageously making it possible to control the conductivity of the plastic. In some embodiments a plastic with a conductivity that is less than about 25,000 ohms-cm provides sufficiently high conductivity to effectively couple the user 29 to the sensing circuit 27. In some embodiments a higher degree of conductivity may be desired. In some embodiments a lower degree of conductivity may be desired. In some embodiments it is advantageous for the user 29 to be coupled to the sensing circuit by a path with less than about fifty mega-ohms.

In some prior art obscured feature detectors, a change in the position of the hand of the user 29 can cause a change in the sensor readings. This may occur in some prior art obscured feature detectors because the hand may form a portion of the path between the sensor plates 5 and ground. As a result, a change in hand position can cause a change in the sensor readings of the sensor plates 5. Disadvantageously, this may reduce the accuracy of the sensor readings.

If it were possible for the size and position of the hand of the user 29 to be constant, it may be possible to do a calibration adjustment to mathematically remove the effect of the hand of the user 29 from the raw sensor readings. However, in practice this may not be feasible. In practice the size, shape, and position of hands of different users 29 may vary too much to make a calibration adjustment practically possible.

To improve performance in light of the aforementioned issues, in some embodiments a conductive hand guard may be positioned between the hand of the user 29 and the sensor plates 5. In some embodiments the hand guard may be grounded to the sensing circuit 27, as illustrated in FIG. 4.

Figure 5:
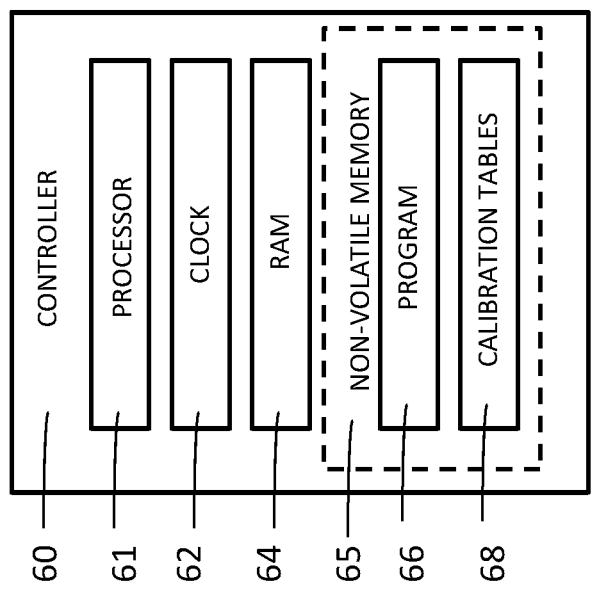
FIG. 5 is a diagram of a controller of an obscured feature detector, according to one embodiment.

FIG. 5 is a diagram of the controller 60, according to one embodiment. The controller 60 includes a processor 61, a clock 62, random access memory (RAM) 64, a non-volatile memory 65, and/or another computer-readable medium. The non-volatile memory 65 may include a program 66 (e.g., in the form of program code or computer-executable instructions for performing operations) and calibration tables 68. In operation, the controller 60 may receive the program 66 and may synchronize the functions of the capacitance-to-digital converter 21 and the display circuit 25 (see FIG. 4). The non-volatile memory 65 receives and stores the program 66 as well as look-up tables (LUT) and calibration tables 68. The program 66 can include a number of suitable algorithms, such as, for example, an initialization algorithm, a calibration algorithm, a pattern-matching algorithm, a multiplexing algorithm, a display management algorithm, an active sensor activation algorithm, and a non-active sensor management algorithm.

FIG. 6 illustrates a routing of sensor plate traces 35 of an obscured feature detector, according to one embodiment. In the illustrated embodiment of FIG. 6, each of the sensor plate traces 35 has substantially similar trace length and the sensor plate traces 35 are surrounded by an active shield trace 36. In some embodiments, as shown in FIG. 6, each of the sensor plate traces 35 is shielded on one or both sides with the active shield trace 36. In some embodiments the active shield trace 36 is routed at a uniform distance from the sensor plate traces 35 on both sides of each sensor plate trace 35. In some embodiments, the active shield traces 36 are substantially parallel to the sensor plate traces 35. In some embodiments, the active shield traces 36 are positioned such that the active shield traces 36 shield the sensor plate traces 35 from external electromagnetic fields. In some embodiments, the sensor plate traces 35 and active shield traces 36 are positioned such that the capacitance between each sensor plate trace 35 and each respective active shield trace 36 is substantially the same for each sensor plate trace 35 and its respective active shield trace 36. In some embodiments a sensor plate trace 35 is accompanied by two active shield traces 36, such that one active shield trace 36 is positioned on each side of the sensor plate trace 35. In some embodiments, a sensor plate trace 35 and an active shield trace 36 are positioned such that there is a constant distance between a sensor plate trace 35 and the respective active shield trace 36, along their length. In some embodiments each of the active shield traces 36 is positioned at a uniform distance away from the respective sensor plate trace 35. In some embodiments a segment of each sensor plate trace 35 and a segment of each active shield trace 36 comprise copper traces on a PCB. In some embodiments, the sensor plate traces 35 and active shield traces 36 are both located on the same layer of a PCB. In some embodiments, the active shield traces 36 are driven at a fixed voltage level. In some embodiments, the active shield traces 36 are driven at a voltage that is similar to the voltage driven on the sensor plate traces 35.

In some embodiments the active shield traces 36 may be routed at a distance of approximately 0.6 mm from each sensor plate trace 35, along as much of the length of the sensor plate trace 35 as is possible. In some embodiments the sensor plate traces 35 are approximately 0.15 mm wide throughout one segment of the sensor plate trace 35.

In some embodiments a shield is configured such that there is a shield layer above each sensor plate trace 35, and a shield layer below each sensor plate trace 35. A shield layer in some embodiments is a layer of copper on an adjacent layer of a PCB. As a result the sensor plate traces 35 may shield both on a layer above the sensor plate traces 35, and on a layer below the sensor plate traces 35, as well as shielding on either side of the sensor plate traces 35. In some embodiments the shielding above the sensor plate trace 35, below the sensor plate trace 35, and on either side of the sensor plate trace 35 are all electrically coupled to each other.

In some embodiments the shield is an active shield. An active shield is a shield that is driven with the same voltage potential as the sensed sensor plate(s). In some embodiments the voltage wave that is driven on the sensor plates 5 and shield may have a triangular shape. In some embodiments the voltage wave that is driven on the sensor plates 5 and shield may have a sinusoidal shape. In some embodiments the voltage that is driven on the sensor plates 5 and shield may have a different wave shape.

Presently available obscured feature detectors may include sensor plate traces to connect a sensing circuit to sensor plates. In some presently available obscured feature detectors no shielding is used to shield the sensor plate traces from interferences. These detectors may be configured to keep potential interferences a safe distance away from the sensor plate traces.

Figure 19:
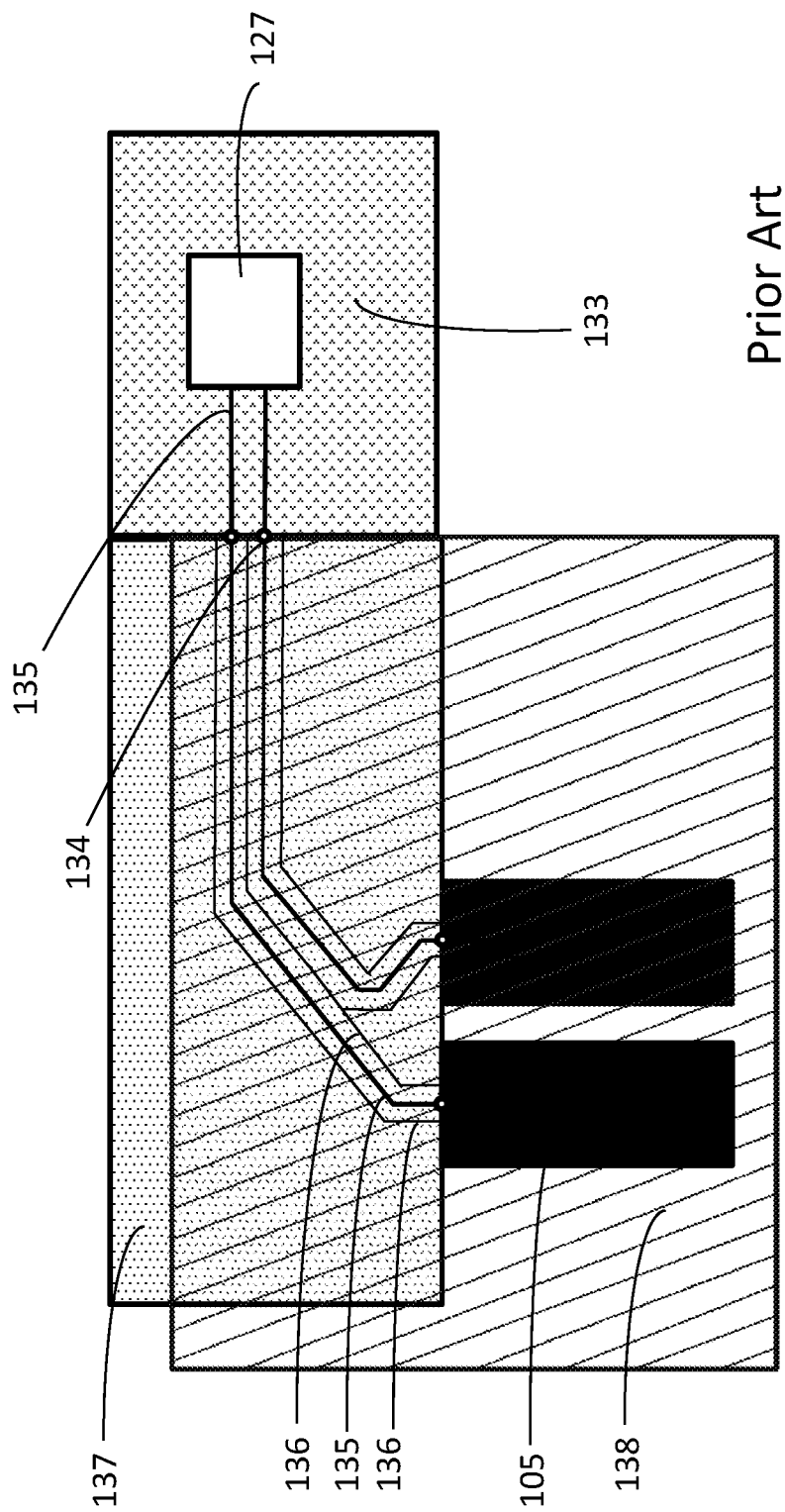
FIG. 19 illustrates a prior art configuration for routing and shielding the sensor plate traces from the controller to the sensor plates.

Other presently available obscured feature detectors may have shielding which may shield the sensor plate traces for a portion of the length of the sensor plate trace. In some presently available obscured feature detectors up to 82% of the sensor plate trace's length may be shielded. An example of a presently available obscured feature detector with shielding is shown in FIG. 19. In presently available obscured feature detectors with shielding, a trace may be routed such that there is a ground plane on a PCB layer that is beneath the sensor plate trace and a via that connects the segment of the sensor plate trace that is on the top layer of the PCB with a segment of the sensor plate trace that is on a lower layer of the PCB. For the segment of the sensor plate trace that is on a lower layer of the PCB, there is a first active shield plane on a layer of the PCB above the sensor plate trace, and a second active shield plane on a PCB layer below sensor plate trace. The first active shield plane, the second active shield plane, and the shield traces are all coupled together and are all driven as an active shield. The active shielding may comprise up to 82% of the length of the sensor plate trace.

In these presently available obscured feature detectors, the material that is between the trace and the ground plane may absorb humidity. The material under some of the traces may absorb more humidity than the material that is under other traces. As a result, exposure to humidity may cause the relative sensor readings of the sensor plate traces to change. In other words, when exposed to humidity some of the sensor readings may change more than other sensor plate sensor readings, as a result of the humidity. Undesirably, the change being the result of the humidity being absorbed between the trace and ground—not as a result of an obscured feature being present.

The present disclosure provides improved obscured feature detectors with shielding that may shield the sensor plate traces for more than 82% of the length of the sensor plate trace.

FIG. 6 also illustrates an improved method of routing the sensor plate traces 35 that may result in better performance. In FIG. 6 there is a very short sensor plate trace 35 that connects the sensing circuit 27 to a via 34. This sensor plate trace 35 may be only one or two millimeters long. It is made as short as is practicably possible. The via 34 connects the segment of the sensor plate trace 35 that is on the top layer of the PCB with a segment of the sensor plate trace 35 that is on a lower layer of the PCB. For the segment of the sensor plate trace 35 that is on a lower layer of the PCB, there is a first active shield plane 37 on a layer of the PCB above the sensor plate trace 35, and a second active shield plane 38 on a PCB layer below sensor plate trace 35. The first active shield plane 37, the second active shield plane 38, and the shield traces are all coupled together and are all driven as an active shield.

When the sensor plate trace 35 and the active shield trace 36 are both driven with the same signal, then they are the same voltage potential, and the capacitance between them may become unimportant. As a result, as the PCB absorbs humidity, and the dielectric constant of the PCB changes, these changes in the dielectric constant of the PCB may not have an effect upon the sensor readings. Changes in the capacitance between the sensor plate trace 35 and the active shielding (e.g., the active shield trace 36) do not affect the sensor readings. The result may be that the sensor plate traces 35 are able to maintain their calibration values better, and the obscured feature detector may be able to determine the locations of the obscured features better.

Figure 7:
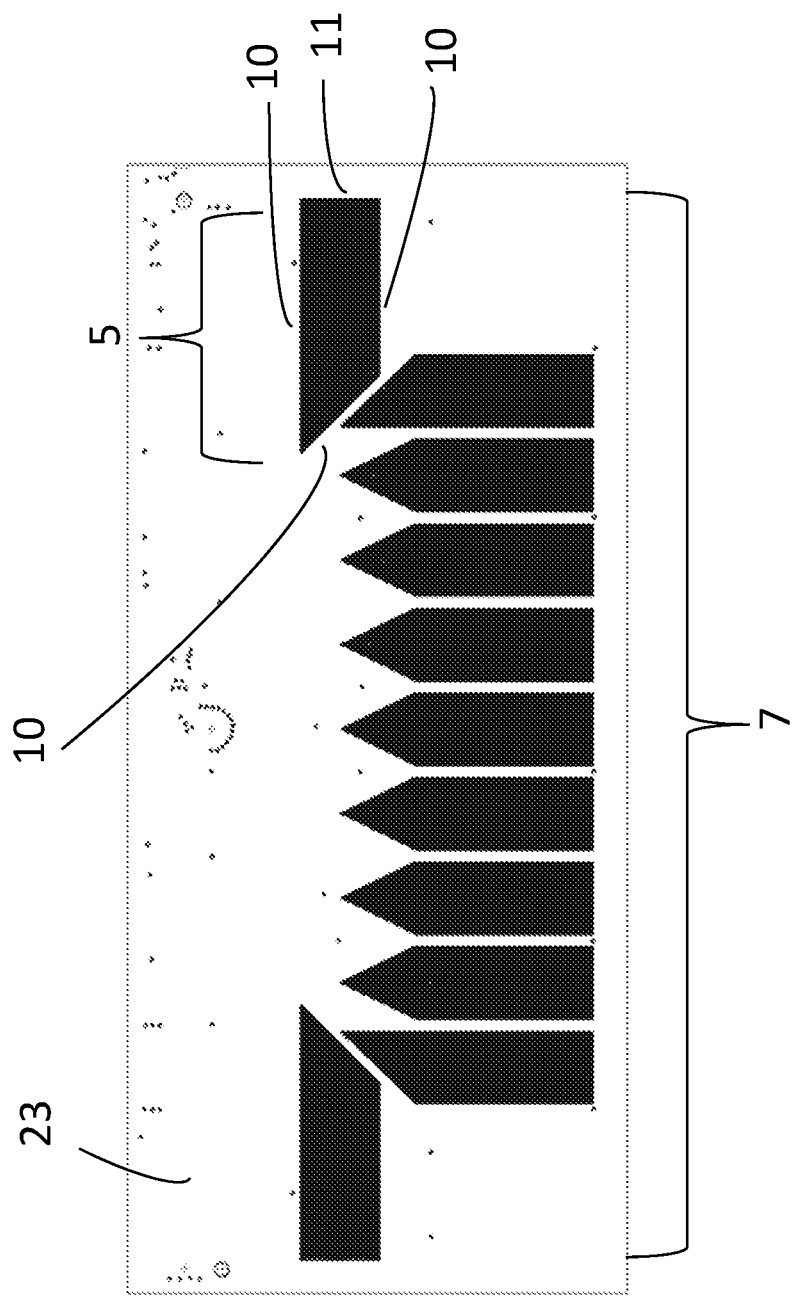
FIG. 7 is a diagram of sensor plate configuration of an obscured feature detector, according to another embodiment.

FIG. 7 is a diagram of sensor plate configuration of an obscured feature detector, according to one embodiment. In this illustrated arrangement each of the eleven different sensor plates 5 have similar primary sensing field zones. FIG. 7 illustrates a sensor plates group 7 that includes eleven sensor plates 5 and an active shield plate 23. In this embodiment the group 7 of eleven sensor plates 5 are on a bottom layer (e.g., a fourth layer) of a PCB. In this embodiment the active shield plate 23 covers the entire third layer of the PCB. In some embodiments, one sensor plate 5 may be sensed at a time. In some embodiments when one sensor plate 5 is sensed, all of the sensor plates 5, including the active shield plate 23, are driven with the same signal as the sensed sensor plate 5. The group 7, plus the active shield plate 23, when driven together may push the field lines deeper into the sensed surface than may be possible if just a single sensor plate 5 was driven. In some embodiments this allows field lines from a single sensor plate 5 to penetrate more deeply, and allows a single sensor plate 5 to sense more deeply, than may be possible if a single sensor plate 5 were driven alone.

In the embodiment of FIG. 7, the sensing field may be created by the combination of the group 7 and the active shield plate 23 when they are both driven with the same signal. In this embodiment the similarities in the configuration of each of the eleven sensor plates 5 may provide each sensor plate 5 with primary sensing zones that are geometrically similar. Likewise, each of the sensor plates 5 may also have similar sensing fields within its respective primary sensing field zones.

The configuration of the sensor plates 5 and the active shield plate 23 in FIG. 7 helps provide similar primary electric field zones for each of the sensor plates 5. Each of the eleven sensor plates 5 has a similar external border 11. They also each have a similar area and a similar interior border 10. They also each have similar electrical surroundings. Each sensor plate 5 is surrounded on either side by either another sensor plate 5 or the active shield plate 23. Both active shield plate 23 and adjacent sensor plates 5 may be driven similarly, and as a result they may each provide equivalent electrical surroundings. The result may be that each of the eleven sensor plates 5 in FIG. 7 has a primary sensing field zone that is geometrically similar.

The shape of each of the eleven the sensor plates 5 in FIG. 7 is not identical. Although it may be ideal for the sensor plates 5 to be identical, an adjustment was made to four of the sensor plates 5 (two sensor plates 5 at each end), so that more similar primary sensing field zones may be obtained. In this embodiment achieving more equivalent primary sensing field zones may be more desirable than having identical sensor plate geometries. Nevertheless all of the eleven sensor plates 5 may have substantially the same area, same external border 11, similar internal border 10 configuration, and similar electrical surroundings. This configuration with these similarities may give each sensor plate 5 an equivalent primary sensing field zone.

In some embodiments it may be beneficial to have similar electrical surroundings that extend beyond the internal borders 10 of a sensor plate 5 for 1× to 1.5× the desired sensing depth. For example, if a 1-inch sensing depth is desired it may be beneficial to have similar electrical surroundings around each sensor plate 5 for at least 1 inch to 1.5 inches beyond the internal borders 10 of each sensor plate 5.

FIG. 8 is a cross-sectional view of an obscured feature detector, according to one embodiment, including a housing, with light pipes and a button, and a printed circuit board. In some embodiments, as shown in FIG. 8, a housing 19 comprises an upper housing, an on-off switch 24, a handle 14, a plurality of light pipes 8, and a power supply compartment. In some embodiments a conforming core (see conforming core apparatus 49 in FIG. 15) may be configured to flexibly couple the housing 19 to a sensor plate board 40. In some embodiments the sensor plate board 40 is a multi-layered printed circuit board with a top layer 44, a second layer 43, a third layer 42, and a bottom layer 41. In some embodiments the sensor plate board 40 is a multi-layered printed circuit board that couples a capacitance-to-digital converter 21, a display circuit 25, and a controller 60, as described above with reference to FIG. 4. In some embodiments, the housing 19 comprises plastic. In some embodiments, the housing 19 comprises ABS plastic. In some embodiments a conductive hand guard 56 shields the user's hand from the sensor plate board 40. In some embodiments the hand guard 56 is connected to the ground of a sensing circuit.

In some embodiments, the handle 14 comprises a gripping surface. In some embodiments a portion of the gripping surface comprises an elastomer that makes the handle 14 easier to grip. The handle 14 is preferably positioned so that the user's hand does not obscure a view of the indicators 6 when grasping the handle 14. In some embodiments, the power supply compartment comprises a cavity for holding a suitable power supply, such as batteries, and a battery cover for accessing the compartment.

In some embodiments the hand guard 56 may be configured so that there are no significant straight-line paths between the sensor plates and the user's hand. In some embodiments the housing 19 may be composed of an electrically conductive material which may comprise the hand guard 56. In some embodiments the conductive layer of material of the hand guard 56 may be a layer of conductive plastic. In some embodiments the conductive layer of material of the hand guard 56 may be a layer of a different conductive material, such as a conductive paint. In some embodiments the conductive layer of material of the hand guard 56 may be a sheet of metal that is hidden within the housing 19. In some embodiments the hand guard 56 may comprise tin-plated steel, which may provide for quick, easy and reliable solder joints. In some embodiments an entire layer of a PCB may comprise the hand guard 56. In some embodiments only a portion of a layer of a PCB may comprise the hand guard 56, because in some embodiments it may not be necessary to for the hand guard 56 to comprise an entire layer. For example a ring around the outside of a PCB may be an effective hand guard 56.

In some embodiments this hand guard 56 is configured to minimize an effect of a size and position of the hand. In some embodiments the hand guard 56 is positioned so that it is near the hand because in some embodiments it may be most effective when it is nearest to the hand. In some embodiments the hand guard 56 may be electrically coupled to the ground of a sensing circuit 27 (see FIG. 4). In some embodiments the hand guard 56 may be coupled to the voltage of the sensing circuit 27. In some embodiments a different electrically conductive point of the sensing circuit 27 may be electrically coupled to the hand guard 56. In some embodiments an electrical wire comprises the electrical path between the hand guard 56 and the sensing circuit 27.

Figure 9:
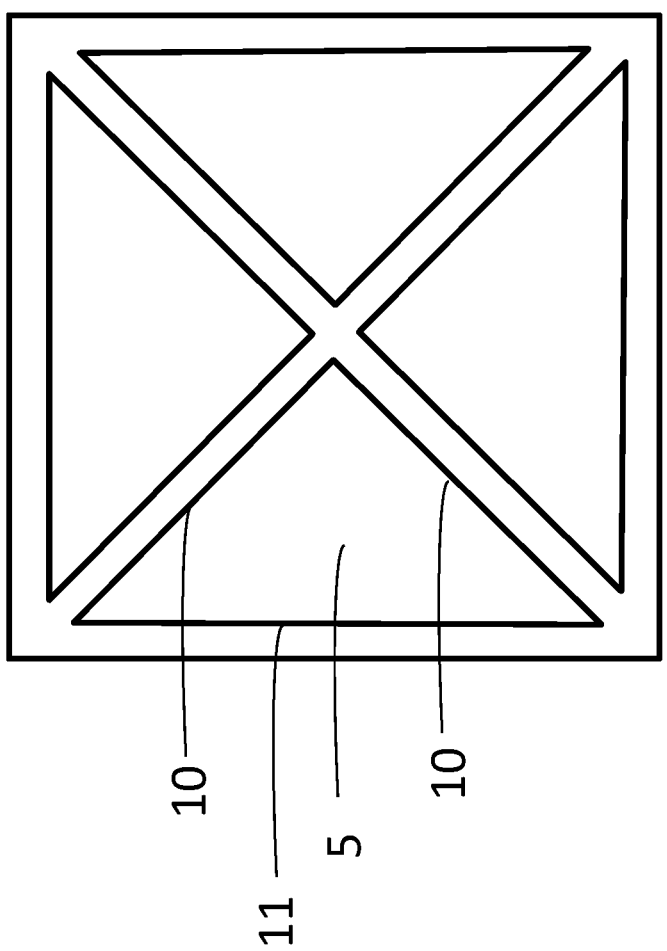
FIG. 9 illustrates a sensor plate group with four sensor plates.

FIG. 9 illustrates a sensor plate group with four sensor plates 5. In some embodiments, as shown in FIG. 9, the sensor plate group may consist of four similar sensor plates 5. In the embodiment shown in FIG. 9, each triangular sensor plate 5 has two sides of a triangle that each form internal borders 10, and one side of the triangle that forms an external border 11.

Figure 10:
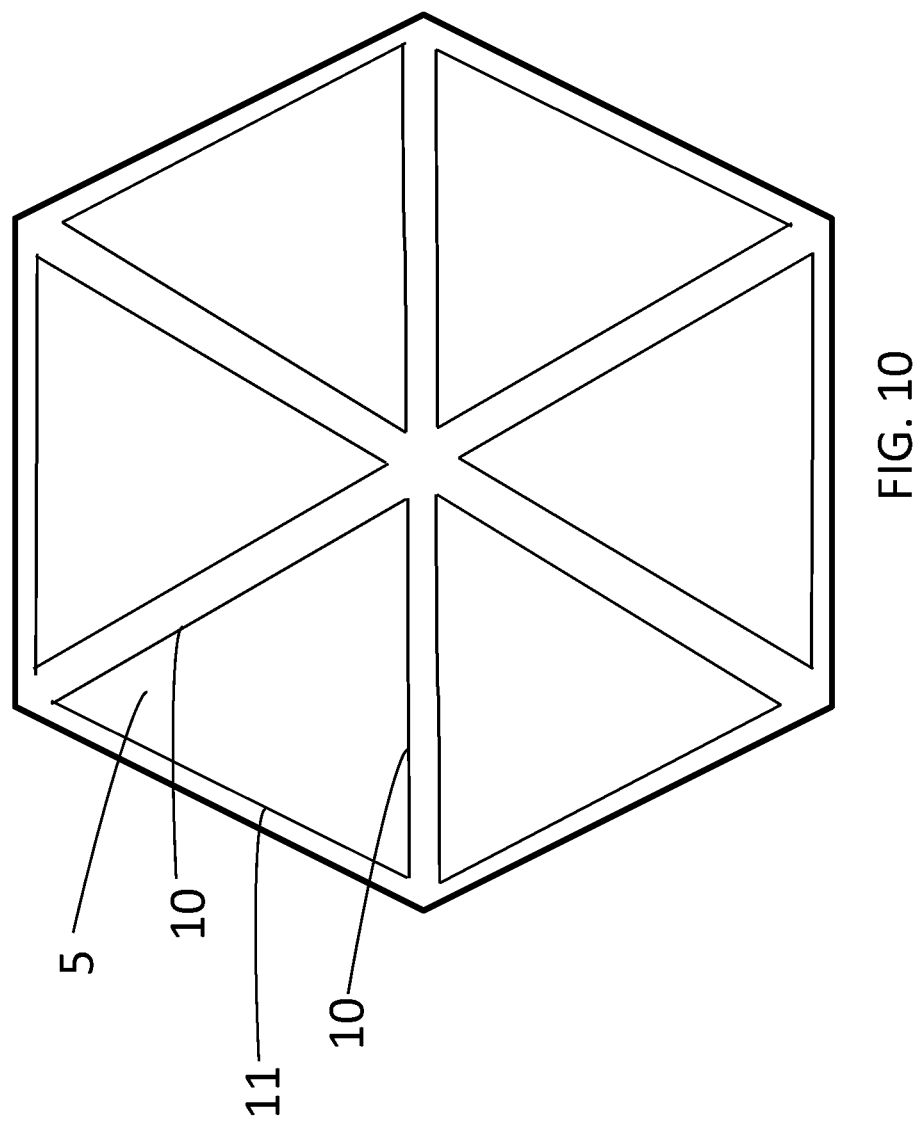
FIG. 10 illustrates a sensor plate group with six sensor plates.

FIG. 10 illustrates a sensor plate group with six sensor plates 5. In some embodiments, as shown in FIG. 10, the sensor plate group may consist of six similar sensor plates 5. In the embodiment shown in FIG. 10, each sensor plate 5 has two straight sides that each form internal borders 10, and a straight side that forms an external border 11. In some embodiments each of the sensor plates 5 have substantially the same area.

Figure 13:
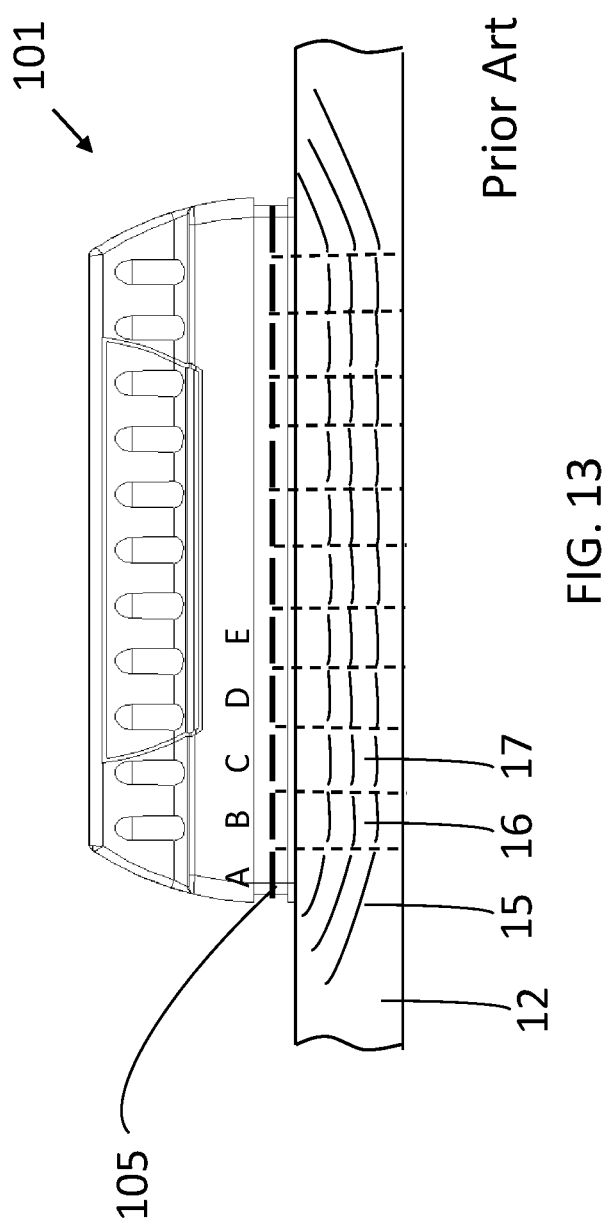
FIG. 13 shows a side view of a prior art obscured feature detector, illustrating primary sensing field zones for several sensor plates.

In prior art obscured feature detectors a set of identical sensor plates 105 are typically arranged in a linear fashion, such as is shown in FIGS. 11, 12, 13, and 14. FIG. 11 is a prior art obscured feature detector 101 placed on a comparatively thinner surface 12. FIG. 12 is the prior art obscured feature detector 101 placed on a comparatively thicker surface 13. FIG. 13 shows a side view of the prior art obscured feature detector 101, illustrating primary sensing field zones 15, 16, 17 for several sensor plates 105, including sensor plates A, B, C, D, E. FIG. 14 shows an elevation view of a bottom surface of the prior art obscured feature detector 101, illustrating the primary sensing field zones 15, 16, 17 for sensor plates A, B, C, D, E.

Referring generally and collectively to FIGS. 11-14, each of the sensor plates 105 performs a sensor reading of the surface 2. The sensor readings are then compared. The sensor plates 105 that have the highest sensor readings are interpreted to be the locations of obscured features. However, as shown in FIG. 11 and FIG. 12, the sensor plates 105 that are near the ends of the group may not respond to obscured features in the same manner as the sensor plates 105 that are near the center. This issue may be particularly evident when the prior art obscured feature detector 101 is moved from the thinner, or less dense, surface 12, to an thicker, or more dense, surface 13.

FIG. 11 shows representative sensor readings of the prior art obscured feature detector 101 that is placed on the relatively thinner surface 12. The relatively thinner surface 12 could be 0.375-inch-thick sheetrock. FIG. 12 shows representative sensor readings of the prior art obscured feature detector 101 that is placed on a relatively thicker surface 13. The relatively thicker surface 13 could be 0.625-inch-thick sheetrock.

In FIG. 11, the prior art obscured feature detector 101 is placed on the relatively thinner surface 12. Each of the sensor plates 105 may have a calibration adjustment so that each has a calibrated reading of, for example, 100. If this same prior art obscured feature detector 101 is then moved to another surface 13 that is thicker, or to a surface that has a higher dielectric constant, the sensor readings would change. An image of the same prior art obscured feature detector 101 on the thicker surface 13 is shown in FIG. 12. Ideally each of the sensor plates 105 on the thicker surface 13 would have similar sensor readings to each other, because they are all on the same thicker surface 13, with no obscured features present. However, it may be observed that the sensor readings of the sensor plates 105 near the ends may see a larger reading increase than the sensor plates 105 near the center. In FIG. 12, it may be seen that the sensor plates 105 near the center have sensor readings of 200, but the sensor plates 105 at the ends have sensor readings of 250.

In the prior art obscured feature detector 101 of FIG. 12, and other prior art obscured feature detectors, the sensor plates 105 that are at the ends are alone in creating electric fields 9 that extend beyond the edges of the group of sensor plates 105. As a result, the sensor plates 105 near the end may respond with a disproportionately higher reading when placed on a thicker surface 13. Disadvantageously, the controller 60 may have difficulty determining if the elevated sensor readings are due to the presence of an obscured feature, or due to the prior art obscured feature detector 101 being placed on the thicker surface 13. The disclosed embodiments may address these and other challenges.

FIG. 13 illustrates the field lines for the prior art obscured feature detector 101 of FIGS. 11 and 12. FIG. 13 shows a group of sensor plates 105 and also shows a two-dimensional representation of the field lines for each of the sensor plates 105. The field lines are shown for illustrative purposes and are a representation of the actual sensing field. The field lines drawn are equipotential electric field lines. However, this drawing does not limit the scope of the disclosure to this type of field alone. Vector electric field lines or magnetic field lines could have been illustrated in the drawing and are within the scope of the disclosure. The sensing field may be an electric field, or it may be a magnetic field, or it may be an electromagnetic field, which is a combination of an electric field and a magnetic field.

In FIG. 13 there are thirteen sensor plates 105. All of the sensor plates 105 may be driven with the same signal simultaneously, while one sensor plate 105 at a time is sensed. Because the sensor plates 105 are driven simultaneously, with the same signal, the sensing field is defined by the field created by the group of sensor plates 105, as illustrated in FIG. 13. An active shield plane is not illustrated in the figure, but an active shield may contribute to the sensing field in some embodiments. Five of the sensor plates 105 are labeled A, B, C, D, E. The field lines emanating from sensor plate E are primarily parallel to sensor plate E. However, the field lines emanating from sensor plate A are not very parallel to sensor plate A. Because the field lines do not have similar direction and strength at each point within the primary sensing field zone the sensor plates A and E do not have similar sensing fields within their primary sensing field zones.

In contrast, sensor plate D and sensor plate E have similar primary sensing field zones because the volume of the sensing field where they are able to sense effectively and the sensing field within that primary sensing field zone are similar. The sensing fields within a primary sensing field zone are similar if the direction of the sensing field and strength of the sensing field are similar at each point within the primary sensing field zone.

FIG. 14 illustrates the same concept from a different angle or perspective. In FIG. 14 the five sensor plates 105 are again labeled A, B, C, D, E. The approximate primary sensing field zones for each of the sensor plates 105 are highlighted. On the two-dimensional drawing of FIG. 14, the primary sensing field zone 15 for sensor plate A is indicated by the drawing of the sensing field lines for sensor plate A. On the two-dimensional drawing of FIG. 14, the primary sensing field zone 16 for sensor plate B is indicated by the drawing of sensing field lines for sensor plate B. On the two-dimensional drawing of FIG. 14, the primary sensing field zone 17 for sensor plate C is indicated by the drawing of sensing field lines for sensor plate C.

FIGS. 13 and 14 illustrate the primary sensing field zone with a two-dimensional drawing. However, in reality a three-dimensional primary sensing field zone may exist. There may be a three-dimensional zone for each sensor plate 105 that comprises the primary sensing field zone for each given sensor plate 105. In contrast to the prior art embodiment of FIGS. 13 and 14, in some embodiments of the present disclosure the sensor plates 105 may have an equivalent primary sensing field zone. Each sensor plate 105 in a group that has an equivalent primary sensing field zone may have an equivalent response to change in surfaces. This disclosure illustrates some configurations wherein each sensor plate 105 in a group may have an equivalent primary sensing field zone. In some embodiments each sensor plate 105 with a similar primary sensing field zone may have a similar change in sensor readings in response to a change in the detected surface. In some embodiments the sensor plates 105 in a group of sensor plates 105 are each radially symmetrical.

Figure 15:
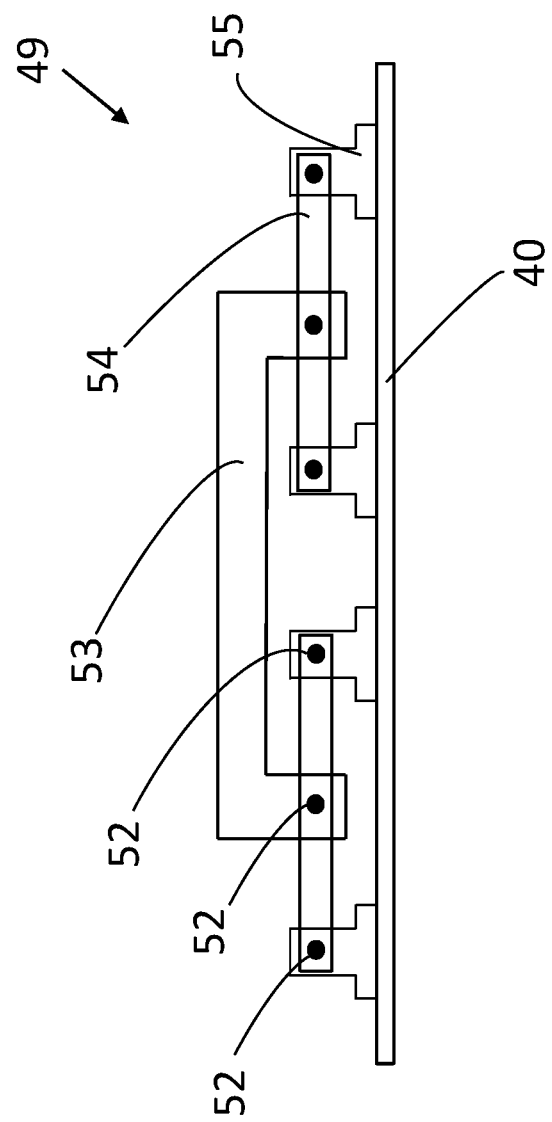
FIG. 15 illustrates diagrammatic side view of a chassis of a core apparatus of a surface-conforming obscured feature detector, according to one embodiment.
Figure 16:
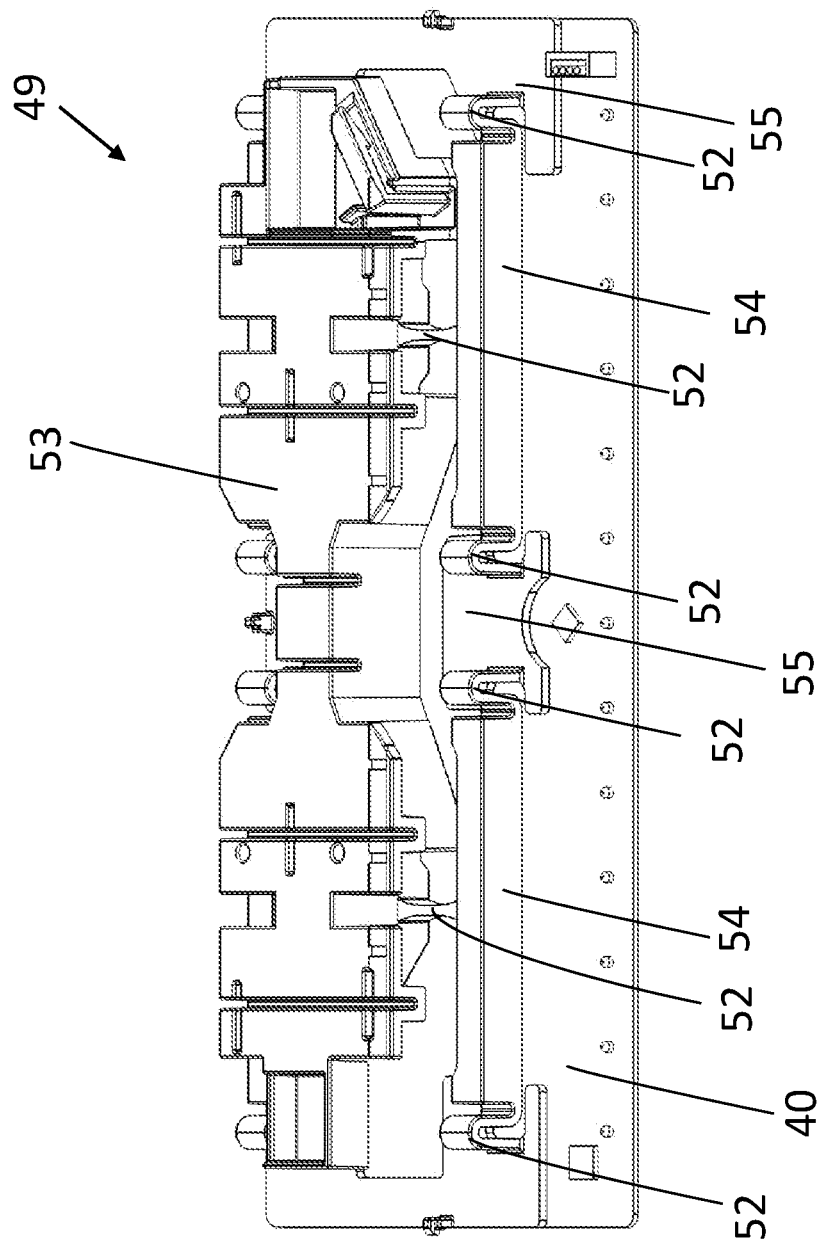
FIG. 16 is perspective view of the chassis of the core apparatus of FIG. 15.

FIG. 15 illustrates a diagrammatic side view of a chassis of a conforming core apparatus 49 of a surface-conforming obscured feature detector, according to one embodiment. FIG. 16 is a perspective view of the chassis of the conforming core apparatus 49 of FIG. 15.

The present disclosure provides various embodiments of a surface-conforming obscured feature detector 1. Conventional detectors have sensor plates 5 that are rigidly connected together, and as a result the size of obscured feature detectors 1 typically remains relatively small to function on the curved surfaces that are typical of many architectural surfaces. The surface-conforming obscured feature detectors 1 disclosed herein conform to the contour of a surface 2, minimize air gaps, and are able to be larger feature detectors that can offer a variety of performance improvements. The improvements described in the present disclosure are applicable to both conventional detectors that are relatively small and to larger feature detectors.

In some embodiments, the obscured feature detector 1 has one or more flexible printed circuit boards, such as a sensor plate board 40, that can bend to match the contour of the surface 2 to be detected. The flexible printed circuit boards comprise a flexible substrate. Other flexible substrates can also be used that can be made of wood, paper, plastic, or other flexible materials. Rigid flex printed circuit boards can also be used.

The one or more printed circuit boards can be flexibly connected to the housing 19 using a flexible medium such as foam rubber, springs, gel, hinges, pivot points, an encapsulated fluid such as air, or other suitable compressible or flexible media. In some embodiments the housing 19 is able to flex. In some embodiments the housing 19 is partially flexible. In some embodiments the housing 19 has integrated plastic leaf springs, or other types of springs or features that provide flexibility. In some embodiments of the obscured feature detector 1, the sensor plates 5 can be mounted on a printed circuit board that is mounted external to the housing 19. In some embodiments the printed circuit board is connected to the housing 19 via a foam rubber ring. In some embodiments, the foam rubber ring is about 7 mm thick and is formed approximately in the shape of a ring that is about 6 mm wide along the long side, and about 5 mm thick along the short side, and approximately follows the perimeter of the housing 19. A permanent adhesive, such as a pressure sensitive acrylic adhesive, can be used to bond the foam rubber ring to the housing 19 and to the printed circuit board.

In some embodiments, the foam rubber ring is compressible, and the printed circuit board is flexible, allowing the obscured feature detector 1 to conform to curvature and irregularities of the surface 2 against which it is placed. A variety of flexible and/or compressible materials can be suitable for the flexible medium. Ethylene propylene diene monomer (EPDM) foam rubber that is rated for 25% compression under about 1.5 pounds per square inch of pressure can be used. Other types of foam rubber such as polyurethane foam or silicon rubber foam can also be used. In some embodiments it is desirable that the flexible medium attached between the printed circuit board substrate and the housing 19 not be electrically conductive or partially conductive, at least not to the extent that it would interfere with operation of the obscured feature detector 1.

In some embodiments, the conforming core 49, such as shown in FIGS. 15 and 16, can flexibly connect the housing 19 to the printed circuit board. In some embodiments the conforming core 49 may have two or more pivots 52. In some embodiments the pivots 52 are flexible joints. In some embodiments the pivots 52 are ball joints. In some embodiments the pivots 52 are hinges. In some embodiments the pivots 52 are living hinges. A living hinge is a thin flexible hinge made from the same material as the two rigid pieces it connects. In some embodiments the pivots 52 may be any of many other flexible mechanisms.

In some embodiments the conforming core 49 comprises a main shaft 53, as illustrated in FIGS. 15 and 16. In some embodiments the main shaft 53 comprises a shaft member. In some embodiments the main shaft 53 comprises a shaft member and two pivots 52. In some embodiments each pivot 52 of the main shaft 53 couples the main shaft 53 to a minor shaft 54. In some embodiments each minor shaft 54 comprises a shaft member and three pivots 52. In some embodiments of the minor shaft 54 there is one pivot 52 near the center of each minor shaft 54 and there are two additional pivots 52, one at each end of the minor shaft 54. In some embodiments there are four feet 55 coupled to the main shaft 53. In some embodiments each foot 55 has a pivot 52. In some embodiments the pivots 52 at each the ends of the two minor shafts 54 are coupled to a pivot 52 in each of the four feet 55. In some embodiments each foot 55 is coupled to the printed circuit board. In some embodiments the printed circuit board can flex to match the contour of the surface 2.

In some embodiments the feet 55 couple the printed circuit board to the minor shaft 54 as shown in FIG. 15 and FIG. 16.

In some embodiments the conforming core 49 comprises the main shaft 53, two minor shafts 54, and four feet 55. In some embodiments there are six pivots 52 in the conforming core 49. In some embodiments there are more than six pivots 52. In some embodiments there are less than six pivots 52.

In some embodiments, as shown in FIG. 16, all of the pivots 52 are living hinges, such that the entire conforming core 49 comprises one single piece of injection molded plastic.

Figure 17:
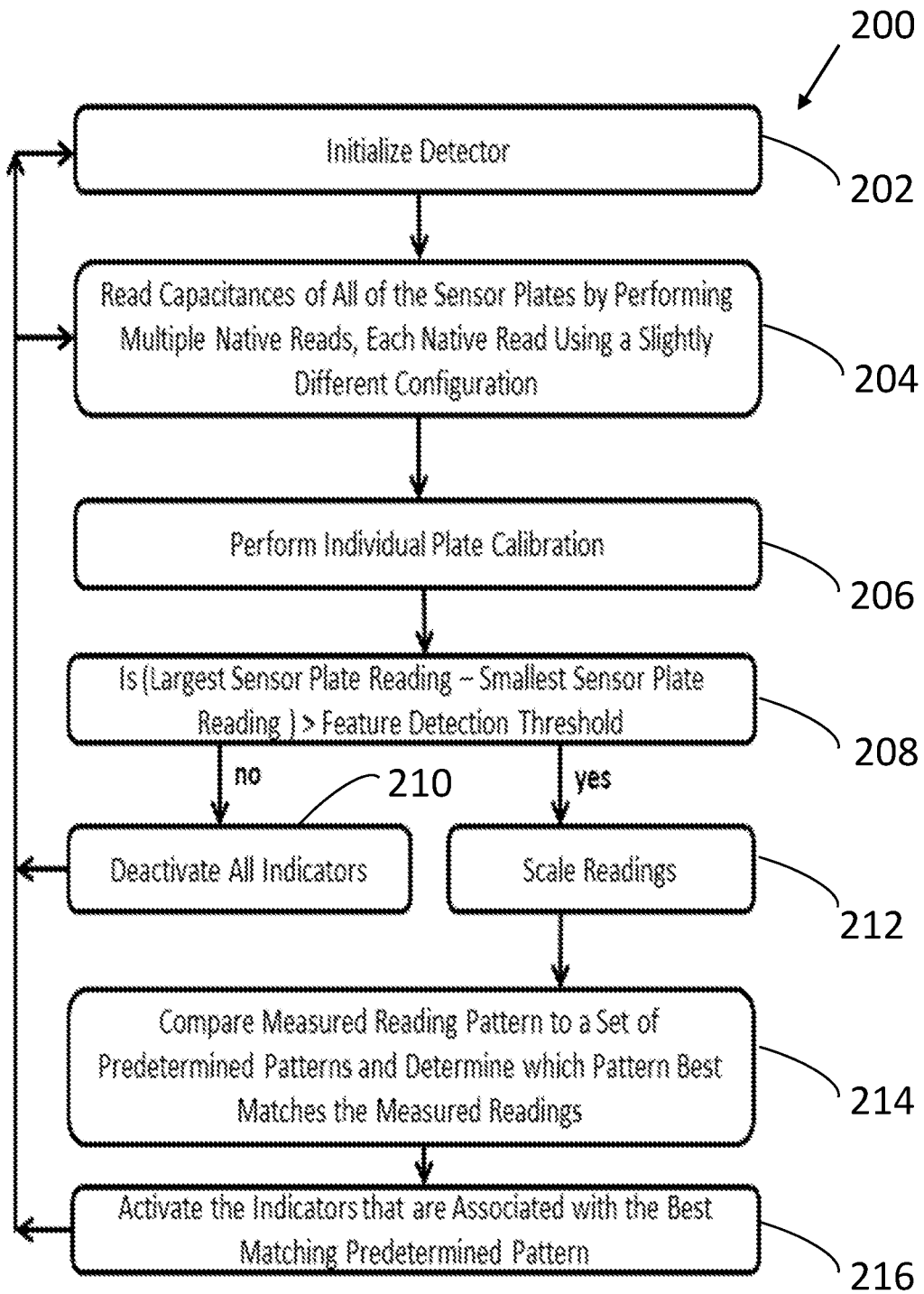
FIG. 17 is a flow diagram of a method of detecting an obscured feature behind a surface, according to one embodiment.

FIG. 17 is a flow diagram of a method 200 of detecting an obscured feature behind a surface, according to one embodiment. A first operation, as illustrated in the flow diagram in FIG. 17, may be to initialize a detector 202, which may involve running an initialization algorithm. The detector may be according to one of the embodiments described herein. After initialization, the sensor plates may be read

204. In some embodiments each of the sensor plates may be read multiple times, each time using a different configuration. The different configurations may comprise different drive currents, different voltage levels, different sensing thresholds, or other different configuration parameters. Each of these readings of the sensor plates may be referred to as native readings. In some embodiments multiple native readings may be added together to comprise a reading. In some embodiments there may be a separate reading for each sensor plate.

In some embodiments, each of these readings has a calibration 206 adjustment performed that is achieved by adding a predetermined calibration value to each reading. In some embodiments, after calibration, the readings for each of the sensor plates would be the same if the detector were to be placed on a uniform surface.

In some embodiments, the largest sensor plate reading is compared 208 to the lowest sensor plate reading. The difference is then compared 208 to a threshold value. In some embodiments, if the difference is less than a predetermined threshold value, then all of the indicators may be turned off 210, to indicate that no stud is present. If the difference is larger than a predetermined threshold value, then a determination may be made as to which indicators to activate. In certain embodiments, the readings may be scaled 212 to a predetermine range, which may involve setting the lowest value to a number such as 0, and scaling the largest reading to a value such as 100. Then all of the intermediate values would be scaled proportionately. The scaled readings may then be compared 214 to predetermined patterns which are scaled in a similar fashion.

In some embodiments there may be a set of predetermine patterns. The set of predetermined patterns may correspond to different combinations of hidden features that the detector may encounter. For example, the set of predetermined patterns may correspond to different positions for a single stud. In some embodiments, the set of predetermined patterns may include positional combinations of two studs. A pattern matching algorithm may be employed to determine which predetermined pattern best matches the reading pattern. The detector may then activate 216 the indicators that correspond to the best matching predetermined pattern.

In other embodiments, after calibrating the sensor plate readings, a determination is made if an obscured feature is present. The lowest sensor plate reading may be subtracted from the highest sensor plate reading. If the difference is greater than a threshold value, then a determination is made that an obscured feature is present. If it is determined that no obscured features are present, then all of the indicators may be deactivated. If an obscured feature is present then a process may begin to determine position(s) and/or width(s) of the obscured feature(s). In some embodiments, all of the current sensor plate readings may be scaled such that the lowest reading is scaled to a predetermined value (such as 0) and the maximum reading is scaled to a second predetermined value (such as 100). All intermediate values may be scaled proportionately. Scaled readings may be easier to compare to a set of predetermined patterns.

FIG. 18 illustrates two different printed circuit boards in a stacked configuration, according to one embodiment of the present disclosure. A sensor plate board 40 and an interconnection board 51 may be stacked on top of one another and bonded to each other. The sensor plate board 40 may include one or more sensor plates. The interconnection board 51 may include the plurality of indicators 6. The sensor plate board 40 and/or the interconnection board 51 may be printed circuit boards (PCBs), or otherwise integrated into a PCB. In some embodiments the bonding agent that bonds the two PCBs 40, 51 together may be solder. In some embodiments solder paste may be used to bond two PCBs 40, 51 together. In some embodiments, they may be bonded together with solder and the process to bond them together may be standard SMT (surface mount technology) processes. The SMT process may include placing one PCB on top of another. In some embodiments, pins may be used to ensure proper alignment of the two PCBs 40, 51. In some embodiments the final step of the SMT process may involve running the stacked PCBs 40, 51 through a reflow oven.

In other embodiments, both the sensor plates and the circuitry may be assembled on a single printed circuit board. A 1.6 mm thick PCB with four layers of copper can be used. In some embodiments the first layer of copper is on the upper surface and all of the electrical components are soldered to this layer. The second layer of copper can be at a position that is about 0.35 mm below the first layer of copper, such that there is about 0.35 mm of printed circuit board substrate between the first and second layers of copper. The third layer of copper can be at a position that is about 0.1 mm below the second layer of copper, such that there is about 0.1 mm of printed circuit board substrate between the second and third layers of copper. A fourth layer of copper can be at a position that is about 0.35 mm below the third layer of copper, such that there is about 0.1 mm of printed circuit board substrate between the third and fourth layers of copper. In some embodiments vias can be drilled to selectively connect the four layers of copper.

In some embodiments a final layer of substrate material that is 0.8 mm thick can be placed to cover the fourth layer of copper. In some embodiments, no holes are drilled through the 0.8 mm thick layer of substrate. The 0.8 mm thick layer of substrate may help protect the circuit from electrostatic discharge. Alternatively, a layer of plastic, or other non-conductive material, can be used to shield the circuit from electrostatic discharge and to physically protect the printed circuit board. In some embodiments, a layer of plastic can be used in addition to a protective layer of circuit board substrate. It is to be understood that the layers and thicknesses indicated here are only exemplary of one embodiment. Other combinations of layers and thicknesses, and materials, can also be used.

In some embodiments the sensor plates can be placed on the fourth layer of copper. A shield to electrically protect the sensor plates from electrical interference from ambient conditions, including the user's hand, may be used. In some embodiments the shield may be placed on the first layer of copper. In some embodiments, a solid shield may cover substantially all of the shield's area, instead of using a mesh, or stripes, or another pattern that may provide less than substantially all of the shield's area.

In some embodiments the electrically conductive paths that link the sensor plates to the capacitance-to-digital converter comprise sensor plate traces. In some embodiments the sensor plate traces are placed primarily on the second layer of copper, and shields for the signals are placed on the first and fourth layers of copper.

In some embodiments, the interconnection boards 51 that are soldered to the sensor plate board 40 are covered with a layer of epoxy, a glob of epoxy, or another conformal coating which may improve the reliability of solder joints. In some embodiments the interconnection boards 51 on the sensor plate board 40 are wire bonded to the printed circuit board with chip-on-board technology. The chip-on-board technology may involve the steps of (1) attaching bare die to the printed circuit board, (2) wire bonding (electrically connecting signals on the bare die to the printed circuit board), and (3) covering the bare die and wire bonds with a coating of epoxy, or other appropriate material. The chip-on-board technology may improve the reliability of solder joints.

In some embodiments integrated circuits that have packages with external leads are used such as QFP packages, TSOP packages, SOIC packages, QSOP packages, or others. Components that have external leads may improve solder joint reliability.

FIG. 19 illustrates a prior art configuration for routing and shielding sensor plate traces 135 from the controller of a sensing circuit 127 to sensor plates 105. In this prior art, the sensor plate trace 135 is routed such that there is a ground plane 133 on a PCB layer that is beneath the sensor plate trace 135. A via 134 connects the segment of the sensor plate trace 135 that is on the top layer of the PCB with a segment of the sensor plate trace 135 that is on a lower layer of the PCB. For the segment of the sensor plate trace 135 that is on a lower layer of the PCB, there is a first active shield plane 137 on a layer of the PCB above the sensor plate trace 135, and a second active shield plane 138 on a PCB layer below sensor plate trace 135. The first active shield plane 137, the second active shield plane 138, and shield traces 136 are all coupled together and are all driven as an active shield. In the prior art the active shielding may comprise up to 82% of the length of the sensor plate trace 135.

In these prior art detectors, the material that is between the sensor plate trace 135 and the ground plane 133 may absorb humidity. The material under some of the sensor plate traces 135 may absorb more humidity than the material that is under other sensor plate traces 135. As a result, exposure to humidity may cause the relative sensor readings of the sensor plate traces 135 to change. In other words, when exposed to humidity some of the sensor plate 105 sensor readings may change more than other sensor plate 105 sensor readings, as a result of the humidity. Undesirably, the change being the result of the humidity being absorbed between the sensor plate trace 135 and ground—not as a result of an obscured feature being present. Improved obscured feature detectors, according to the present disclosure, may shield the sensor plate traces 135 for more than 82% of the length of the sensor plate trace 135.

EXAMPLES

The following examples pertain to further embodiments.

Example 1

An obscured feature detector comprising: three or more sensor plates each to take a sensor reading that varies based on a proximity of the sensor plate to one or more surrounding objects and on a material property of each of the one or more surrounding objects, the three or more sensor plates to collectively create a sensing field, each individual sensor plate of the three or more sensor plates to create a corresponding primary sensing field zone that is a geometric three-dimensional volume within the sensing field where the individual sensor plate contributes more strongly to the sensing field than any other of the three or more sensor plates, the three or more sensor plates all to create primary sensing field zones that are geometrically similar; a sensing circuit coupled to the three or more sensor plates, the circuit being configured to measure the sensor readings of the three or more sensor plates; and an indicator to be toggled between a deactivated state and an activated state to indicate a location within the sensing field of a region of relative high sensor reading.

Example 2

The obscured feature detector of Example 1, wherein the primary sensing field zones are to be geometrically similar when all of the three or more sensor plates are under equivalent electrical conditions.

Example 3

The obscured feature detector of Example 1, wherein the primary sensing field zones are to be geometrically similar when all of the three or more sensor plates are under the operating conditions of the detector.

Example 4

The obscured feature detector of Example 1, wherein the three or more sensor plates comprise eight sensor plates.

Example 5

The obscured feature detector of Example 1, wherein the three or more sensor plates comprise four sensor plates.

Example 6

The obscured feature detector of Example 1, further comprising an electrically conductive trace that forms an electrically conductive path between a sensor plate and the sensing circuit.

Example 7

The obscured feature detector of Example 1, wherein the three or more sensor plates are configured to collectively create a three-dimensional sensing field.

Example 8

The obscured feature detector of Example 1, further comprising a controller coupled to the sensing circuit, the controller being configured to analyze the sensor readings measured by the sensing circuit, wherein the controller is configured to set the indicator to indicate a location of a region of relative high sensor reading on one or more sensor plates of the three or more sensor plates.

Example 9

The obscured feature detector of Example 1, comprising a plurality of indicators to be toggled between a deactivated state and an activated state to indicate a location of a region of relative high sensor reading on the three or more sensor plates.

Example 10

The obscured feature detector of Example 1, wherein the sensor reading comprises a capacitance reading, wherein the sensing circuit senses the capacitance surrounding each sensor plate.

Example 11

The obscured feature detector of Example 1, wherein the sensor reading comprises an electromagnetic reading, wherein the sensing circuit senses an electromagnetic field surrounding each sensor plate.

Example 12

The obscured feature detector of Example 1, wherein the sensing circuit reads at least two of the three or more sensor plates simultaneously.

Example 13

The obscured feature detector of Example 1, wherein the three or more sensor plates are arranged in a square pattern.

Example 14

The obscured feature detector of Example 1, wherein all of the three or more sensor plates have a similar geometry.

Example 15

The obscured feature detector of Example 1, wherein each of the three or more sensor plates is arranged in a radially symmetrical pattern.

Example 16

The obscured feature detector of Example 1, wherein the three or more sensor plates are arranged in radial symmetry.

Example 17

The obscured feature detector of Example 1, wherein the three or more sensor plates are arranged in radially symmetrical pattern.

Example 18

The obscured feature detector of Example 1, wherein each sensor plate of the three or more sensor plates has an internal border extending along at least a portion of an internal border of one or more other sensor plates of the three or more sensor plates and an external border disposed at an outer perimeter of the three or more sensor plates, wherein the external border of each sensor plate is similar in length to the external border of every other sensor plate of the three or more sensor plates.

Example 19

The obscured feature detector of Example 1, wherein each sensor plate is a combination of two or more mini sensor plates, wherein two or more mini sensor plates are sensed simultaneously.

Example 20

The obscured feature detector of Example 1, wherein one of the sensor plates is an active shield.

Example 21

An obscured feature detector comprising: a group of three or more sensor plates configured or arranged so that each sensor plate has an internal border extending along at least a portion of an internal border of one or more other sensor plates of the group and an external border disposed at an outer perimeter of the group, wherein the external border of each sensor plate is similar in length to the external border of every other sensor plate of the group of three or more sensor plates, each sensor plate to take a sensor reading that varies based on a proximity of the sensor plate to one or more surrounding objects and on a material property of each of the one or more surrounding objects; a sensing circuit coupled to the group of three or more sensor plates, the circuit being configured to measure the sensor readings of the three or more sensor plates; and an indicator to be toggled between a deactivated state and an activated state to indicate a location of a region of relative high sensor reading.

Example 22

The obscured feature detector of Example 21, wherein the group of three or more sensor plates comprises eight sensor plates.

Example 23

The obscured feature detector of Example 22, wherein the eight sensor plates are arranged in two or more sets, each set comprising two or more sensor plates.

Example 24

The obscured feature detector of Example 21, wherein the group of three or more sensor plates comprises four sensor plates.

Example 25

The obscured feature detector of Example 24, wherein the four sensor plates are arranged in sets of two sensor plates.

Example 26

The obscured feature detector of Example 21, further comprising an electrically conductive trace that forms an electrically conductive path between the group of three or more sensor plates and the sensing circuit.

Example 27

The obscured feature detector of Example 21, further comprising a controller coupled to the sensing circuit, the controller being configured to analyze the sensor readings measured by the sensing circuit, wherein the controller is configured to activate the indicator to indicate a location of a region of relative high sensor reading.

Example 28

The obscured feature detector of Example 21, comprising a plurality of indicators to be toggled between a deactivated state and an activated state to indicate a location of a region of relative high sensor reading on one or more of the three or more sensor plates.

Example 29

The obscured feature detector of Example 21, wherein the sensor reading comprises a capacitance reading, wherein the sensing circuit senses the capacitance surrounding each sensor plate.

Example 30

The obscured feature detector of Example 21, wherein the sensor reading comprises an electromagnetic reading, wherein the sensing circuit senses an electromagnetic field surrounding each sensor plate.

Example 31

The obscured feature detector of Example 21, wherein the sensing circuit reads at least two of the three or more sensor plates simultaneously.

Example 32

The obscured feature detector of Example 21, wherein each sensor plate may be a combination of two or more mini sensor plates, wherein two or more mini sensor plates are sensed simultaneously.

Example 33

The obscured feature detector of Example 21, wherein the three or more sensor plates all have substantially similar effective border lengths.

Example 34

The obscured feature detector of Example 21, wherein the three or more sensor plates all have substantially similar internal border lengths.

Example 35

The obscured feature detector of Example 21, wherein the three or more sensor plates all have substantially similar geometries.

Example 36

The obscured feature detector of Example 21, wherein the three or more sensor plates all have similar internal border contours.

Example 37

The obscured feature detector of Example 21, wherein the three or more sensor plates all have similar external border contours.

Example 38

The obscured feature detector of Example 21, wherein the group of three or more sensor plates are arranged in a hexagonal pattern.

Example 39

The obscured feature detector of Example 21, wherein the group of three or more sensor plates are arranged in two sets of sensor plates, each set of sensor plates comprising three or more sensor plates with a substantially similar external border length.

Example 40

The obscured feature detector of Example 21, wherein the group of three or more sensor plates are arranged in two sets of sensor plates, each set of sensor plates comprising three or more sensor plates with a substantially similar geometry.

Example 41

The obscured feature detector of Example 21, wherein the group of three or more sensor plates are arranged in two sets of sensor plates, each set of sensor plates comprising three or more sensor plates with a substantially similar external border contour.

Example 42

The obscured feature detector of Example 21, wherein the group of three or more sensor plates collectively create a three-dimensional sensing field, the three or more sensor plates positioned so that each individual sensor plate of the three or more sensor plates has a corresponding primary sensing field zone that is a geometric three-dimensional volume of the sensing field where the individual sensor plate contributes more strongly to the sensing field than any other of the three or more sensor plates, wherein the three or more sensor plates all have primary sensing field zones that are geometrically similar.

Example 43

The obscured feature detector of Example 21, wherein the group of three or more sensor plates collectively create a sensing field, the three or more sensor plates positioned so that each individual sensor plate of the three or more sensor plates has a corresponding primary sensing field zone that is a geometric three-dimensional volume of the sensing field where the individual sensor plate contributes more strongly to the sensing field than any other of the three or more sensor plates, wherein the three or more sensor plates have primary sensing field zones that are geometrically similar.

Example 44

The obscured feature detector of Example 21, wherein each sensor plate may be a combination of two or more mini sensor plates, wherein two or more mini sensor plates are sensed simultaneously.

Example 45

A method of detecting an obscured feature behind a surface, comprising: taking a sensor reading of sensor plates of an obscured feature detector that is disposed in a stationary position on the surface, the obscured feature detector comprising three or more sensor plates, a sensing circuit, and an indicator, wherein the three or more sensor plates collectively create a sensing field, wherein the three or more sensor plates are configured so that each individual sensor plate of the three or more sensor plates has a corresponding primary sensing field zone that is a geometric three-dimensional volume of the sensing field where the individual sensor plate contributes more strongly to the sensing field than any other of the three or more sensor plates, wherein the three or more sensor plates have primary sensing field zones that are geometrically similar; measuring, via the sensing circuit, the sensor readings of the three or more sensor plates; comparing measured sensor readings in different regions of the sensing field; and toggling the indicator from a deactivated state to an activated state to indicate a location of a region of relative high sensor reading.

Example 46

The method of Example 45, wherein the three or more sensor plates and one active shield create the three-dimensional sensing field, wherein the active shield is driven with a signal that is similar to the signal on the sensor plates.

Example 47

The method of Example 45, wherein the measured sensor reading is a capacitive reading.

Example 48

The method of Example 45, wherein the measured sensor reading is an electromagnetic reading.

Example 49

The method of Example 45, wherein each of the sensor plates has a similar geometry.

Example 50

A method of detecting an obscured feature behind a surface, comprising: taking a sensor reading of sensor plates of an obscured feature detector that is disposed in a stationary position on the surface, the obscured feature detector comprising a group of three or more sensor plates, a sensing circuit, and an indicator, wherein the group of three or more sensor plates are configured or arranged so that each sensor plate has an internal border extending along at least a portion of an internal border of one or more other sensor plates of the group and an external border disposed at an outer perimeter of the group, wherein the external border of each sensor plate is similar in length to the external border of every other sensor plate of the group of three or more sensor plates, each sensor plate to take a sensor reading that varies based on a proximity of the sensor plate to one or more surrounding objects and on a material property of each of the one or more surrounding objects; measuring, via the sensing circuit, the sensor readings of the three or more sensor plates; comparing measured sensor readings in different regions of the sensing field; and toggling the indicator from a deactivated state to an activated state to indicate a location of a region of relative high sensor reading on the three or more sensor plates.

Example 51

The method of Example 50, wherein the three sensor or more plates and one active shield create the three-dimensional sensing field, wherein the active shield is driven with a signal that is similar to the signal on the sensor plates.

Example 52

The method of Example 50, wherein the measured sensor reading is a capacitive reading.

Example 53

The method of Example 50, wherein the measured sensor reading is an electromagnetic reading.

Example 54

The method of Example 50, wherein each of the sensor plates has a similar geometry.

Example 55

An obscured feature detector comprising: one or more sensor plates; a sensing circuit coupled to the one or more sensor plates, the circuit being configured to measure sensor readings of the one or more sensor plates; a handle configured to be grasped by a user of the obscured feature detector; a hand guard comprised of an electrically conductive material and positioned between at least a portion of the handle and the sensor plates; and an indicator to be toggled between a deactivated state and an activated state to indicate a location of a region of relative high sensor reading. The hand guard can have the same dimensions as the group of one or more sensor plates. A perimeter of the hand guard can be parallel to the perimeter of the group of one or more sensor plates. The hand guard and group of sensor plates can be positioned in parallel planes, wherein the hand guard and group of sensor plates are centered on each other. The hand guard can be electrically coupled to an electrically conductive point of the sensing circuit. The hand guard can be electrically coupled to an electrically conductive point of the sensing circuit, wherein the hand guard is coupled to an external surface of the obscured feature detector.

Example 56

The obscured feature detector of Example 55, wherein the hand guard comprises sheet metal.

Example 57

The obscured feature detector of Example 55, wherein the hand guard comprises tin-plated steel.

Example 58

The obscured feature detector of Example 55, wherein the hand guard comprises an electrically conductive layer of paint.

Example 59

The obscured feature detector of Example 55, wherein the hand guard comprises an electrically conductive plastic.

Example 60

The obscured feature detector of Example 55, wherein the hand guard comprises one layer of a printed circuit board.

Example 61

The obscured feature detector of Example 55, wherein the hand guard is electrically connected to an electrically conductive point of the sensing circuit.

Example 62

The obscured feature detector of Example 55, wherein the hand guard is electrically coupled to the ground of the sensing circuit.

Example 63

The obscured feature detector of Example 55, wherein the hand guard is electrically coupled to the voltage source of the sensing circuit.

Example 64

The obscured feature detector of Example 65, wherein each of the sensor plates is configured to take a sensor reading that varies based on a proximity of the sensor plate to one or more surrounding objects and on a material property of each of the one or more surrounding objects.

Example 65

A method of detecting an obscured feature behind a surface, comprising: taking a sensor reading of one or more sensor plates of an obscured feature detector, the obscured feature detector comprising one or more sensor plates, a sensing circuit, a handle, a hand guard, and an indicator, wherein the hand guard is comprised of an electrically conductive material and positioned between at least a portion of the handle and the one or more sensor plates, wherein the sensor reading varies based on a proximity of a sensor plate of the one or more sensor plates to one or more surrounding objects and on a material property of each of the one or more surrounding objects; measuring, via the sensing circuit, the sensor readings of the one or more sensor plates; and setting the indicator to indicate a location of a region of relative high sensor reading.

Example 66

The method of Example 65, wherein the sensor reading is a capacitive reading.

Example 67

The method of Example 65, wherein the sensor reading is an electromagnetic reading.

Example 68

A method of manufacturing an obscured feature detector, comprising: configuring three or more sensor plates to collectively create a sensing field, each individual sensor plate of the three or more sensor plates to create a corresponding primary sensing field zone within the sensing field where the individual sensor plate contributes more strongly to the sensing field than any other of the three or more sensor plates, the three or more sensor plates to create primary sensing field zones that are geometrically similar, wherein each of the three or more sensor plates are configured to take a sensor reading that varies based on a proximity of the sensor plate to one or more surrounding objects and on a material property of each of the one or more surrounding objects; electrically coupling a sensing circuit to the three or more sensor plates, the circuit being configured to measure the sensor readings of the three or more sensor plates; electrically coupling an indicator to the sensing circuit, the indicator to be toggled between a deactivated state and an activated state to indicate a location within the sensing field of a region of relative high sensor reading; positioning the three or more sensor plates and the sensing circuit within a housing comprising a handle configured to be grasped by a user of the obscured feature detector; and positioning a hand guard between the handle and the three or more sensor plates, the hand guard comprising an electrically conductive material.

Example 69

An obscured feature detector comprising: an array of sensor plates; a sensing circuit coupled to the array of sensor plates, the circuit being configured to measure sensor readings of the array of sensor plates; an electrically conductive path that couples an electrically conductive point of the sensing circuit to an external surface of the obscured feature detector; and an indicator to be toggled between a deactivated state and an activated state to indicate a location of a region of relative high sensor reading.

Example 70

The obscured feature detector of Example 69, wherein the electrically conductive path comprises a metallic wire.

Example 71

The obscured feature detector of Example 69, wherein the electrically conductive path comprises conductive plastic.

Example 72

The obscured feature detector of Example 69, wherein one end of the electrically conductive path is coupled to the ground of the sensing circuit.

Example 73

The obscured feature detector of Example 69, wherein one end of the electrically conductive path is coupled to a voltage source of the sensing circuit.

Example 74

The obscured feature detector of Example 69, wherein one end of the electrically conductive path is coupled to a handle of the obscured feature detector.

Example 75

The obscured feature detector of Example 74, wherein the handle comprises an electrically conductive plastic.

Example 76

The obscured feature detector of Example 69, wherein one end of the electrically conductive path is coupled to a button of the obscured feature detector. The electrically conductive path can be coupled to an electrically conductive hand guard.

Example 77

The obscured feature detector of Example 76, wherein the button comprises an electrically conductive plastic.

Example 78

The obscured feature detector of Example 69, wherein the electrically conductive path has a resistance less than fifty mega-ohms. The electrically conductive path can have a resistance less than ten mega-ohms.

Example 79

A method of detecting an obscured feature behind a surface, comprising: taking a sensor reading of one or more sensor plates of an obscured feature detector, the obscured feature detector comprising one or more sensor plates, a sensing circuit, a housing with an external surface, an electrically conductive path, and an indicator, wherein the electrically conductive path is comprised of an electrically conductive material that electrically couples a portion of the external surface of the obscured feature detector to an electrically conductive point of the sensing circuit; each sensor reading that varies based on a proximity of the sensor plate to one or more surrounding objects and on a material property of each of the one or more surrounding objects; measuring, via the sensing circuit, the sensor readings of the sensor plate(s); and setting the indicator to indicate a location of a region of relative high sensor reading.

Example 80

The method of Example 79, wherein the sensor reading is a capacitive reading.

Example 81

The method of Example 79, wherein the measured sensor reading is an electromagnetic reading.

Example 82

The method of Example 79, wherein the electrically conductive path comprises a metallic wire.

Example 83

The method of Example 79, wherein the electrically conductive path has a resistance less than fifty mega-ohms.

Example 84

The method of Example 79, wherein one end of the electrically conductive path is coupled to a button of the obscured feature detector and the button is electrically conductive.

Example 85

A method of manufacturing an obscured feature detector, comprising: configuring three or more sensor plates to collectively create a sensing field, each individual sensor plate of the three or more sensor plates to create a corresponding primary sensing field zone within the sensing field where the individual sensor plate contributes more strongly to the sensing field than any other of the three or more sensor plates, the three or more sensor plates to create primary sensing field zones that are geometrically similar, wherein each of the three or more sensor plates are configured to take a sensor reading that varies based on a proximity of the sensor plate to one or more surrounding objects and on a material property of each of the one or more surrounding objects; electrically coupling a sensing circuit to the three or more sensor plates, the circuit being configured to measure the sensor readings of the three or more sensor plates; electrically coupling an indicator to the sensing circuit, the indicator to be toggled between a deactivated state and an activated state to indicate a location within the sensing field of a region of relative high sensor reading; and electrically coupling an electrically conductive point of the sensing circuit to an external surface of the obscured feature detector.

Example 86

An obscured feature detector comprising: one or more sensor plates; a sensing circuit coupled to the one or more sensor plates, the circuit being configured to measure sensor readings of the one or more sensor plates; a sensor plate trace that forms an electrically conductive path between a sensor plate of the one or more sensor plates and the sensing circuit, the electrically conductive trace having a length measured from a connection at the sensor plate and a connection at the sensing circuit; a shield that substantially surrounds the electrically conductive trace for more than 82% of the length of the sensor plate trace; and an indicator to be toggled between a deactivated state and an activated state to indicate a location of a region of relative high sensor reading.

Example 87

The obscured feature detector of Example 86, wherein the sensor plate traces are comprised of layers of copper on a printed circuit board.

Example 88

The obscured feature detector of claim 86, wherein the shield for a sensor plate trace is comprised of material on three different layers of a printed circuit board.

Example 89

The obscured feature detector of Example 86, wherein the shield for a sensor plate trace is comprised of conductive material on three different layers of a printed circuit board, wherein the shield comprises conductive material on a layer that is above a sensor plate trace, conductive material that is on a layer below a sensor plate trace, and conductive material that is on either side of a sensor plate trace and on the same layer as the sensor plate trace.

Example 90

The obscured feature detector of Example 86, wherein the shield comprises coaxial cable.

Example 91

The obscured feature detector of Example 86, wherein a portion of the shield comprises traces on the same layer of the PCB as the sensor plate traces.

Example 92

The obscured feature detector of Example 86, wherein two or more sensor plate traces are substantially surrounded by a single shield that surrounds both sensor plate traces.

Example 93

A method of detecting an obscured feature behind a surface, comprising: taking a sensor reading of one or more sensor plates of an obscured feature detector, the obscured feature detector comprising one or more sensor plates, a sensing circuit, one or more sensor plate traces that connect the sensor plates to the sensing circuit, a shield that substantially surrounds the sensor plate trace(s) for more than 82% of a length of the sensor plate trace and an indicator, each sensor reading that varies based on a proximity of the sensor plate to one or more surrounding objects and on a material property of each of the one or more surrounding objects; measuring, via the sensing circuit, the sensor readings of the sensor plate(s); and setting the indicator to indicate a location of a region of relative high sensor reading.

Example 94

The method of Example 93, wherein the measured sensor reading is a capacitive reading.

Example 95

The method of Example 93, wherein the measured sensor reading is an electromagnetic reading.

Example 96

The method of Example 93, wherein the sensor plate traces are comprised of layers of copper on a printed circuit board.

Example 97

The method of Example 93, wherein the shield for a sensor plate trace is comprised of material on three different layers of a printed circuit board.

Example 98

The method of Example 93, wherein the shield for a sensor plate trace comprises conductive material on three different layers of a printed circuit board, wherein the shield may be comprised of conductive material on a layer that is above a sensor plate trace, conductive material that is on a layer below a sensor plate trace, and conductive material that is on either side of a sensor plate trace, which may be on the same layer as the sensor plate trace.

Example 99

The method of Example 93, wherein the shield comprises coaxial cable.

Example 100

The method of Example 93, wherein a portion of the shield comprises traces on the same layer of the PCB as the sensor plate traces.

Example 101

The method of Example 93, wherein two or more sensor plate traces are substantially surrounded by a single shield that surrounds both sensor plate traces.

Example 102

A method of manufacturing an obscured feature detector, comprising: configuring three or more sensor plates to collectively create a sensing field, each individual sensor plate of the three or more sensor plates to create a corresponding primary sensing field zone within the sensing field where the individual sensor plate contributes more strongly to the sensing field than any other of the three or more sensor plates, the three or more sensor plates to create primary sensing field zones that are geometrically similar, wherein each of the three or more sensor plates are configured to take a sensor reading that varies based on a proximity of the sensor plate to one or more surrounding objects and on a material property of each of the one or more surrounding objects; positioning a sensor plate trace that forms an electrically conductive path coupling a sensing circuit to the three or more sensor plates, the sensing circuit configured to measure the sensor readings of the three or more sensor plates; and positioning a shield that substantially surrounds the electrically conductive trace for more than 82% of the length of the sensor plate trace.

Example 103

A surface-conforming obscured feature detector comprising: a group of sensor plates; a sensing circuit coupled to the group of sensor plates, the circuit being configured to measure sensor readings of the group of sensor plates; and a conforming core to which the group of sensor plates is flexibly connected, the conforming core formed of a flexible substrate that is conformable to curvature and irregularities of a curved surface through which an obscured feature is to be sensed, the conforming core comprising: a shaft member having two or more flexible joints each configured to pivot on a different axis, the two or more flexible joints to couple the shaft member to the flexible substrate; and an indicator to be toggled between a deactivated state and an activated state to indicate a location of a region of relative high sensor reading on the three or more sensor plates.

Example 104

The surface-conforming obscured feature detector of Example 103, wherein the flexible joints are composed of plastic.

Example 105

The surface-conforming obscured feature detector of Example 103, wherein the flexible joints are composed of plastic that is configured to flex.

Example 106

The surface-conforming obscured feature detector of Example 103, wherein the flexible joints comprise ball joints.

Example 107

The surface-conforming obscured feature detector of Example 103, wherein the flexible substrate is a printed circuit board.

Example 108

The surface-conforming obscured feature detector of Example 103, wherein the sensor plates are comprised of electrically conductive matter.

Example 109

An obscured feature detector comprising: three or more sensor plates each to take a sensor reading that varies based on a proximity of the sensor plate to one or more surrounding objects and on a material property of each of the one or more surrounding objects, the three or more sensor plates collectively creating a sensing field, the three or more sensor plates positioned so that each individual sensor plate of the three or more sensor plates has a corresponding primary sensing field zone that is a geometric three-dimensional volume of the sensing field where the individual sensor is able to sense effectively wherein the three or more sensor plates have primary sensing field zones that are geometrically similar and wherein each of the three or more sensor plates has similar sensing fields within its respective primary sensing field zones.

Example 110

The obscured feature detector of Example 109, wherein the primary sensing field zones are to be geometrically similar when all of the three or more sensor plates are under equivalent electrical conditions.

Example 111

The obscured feature detector of Example 109, wherein the primary sensing field zones are to be geometrically similar when all of the three or more sensor plates are under the operating conditions of the detector.

Example 112

The obscured feature detector of Example 109, wherein the three or more sensor plates comprise eight sensor plates.

Example 113

The obscured feature detector of Example 109, wherein the three or more sensor plates comprise four sensor plates.

Example 114

The obscured feature detector of Example 109, further comprising an electrically conductive trace that forms an electrically conductive path between a sensor plate and the sensing circuit.

Example 115

The obscured feature detector of Example 109, wherein the three or more sensor plates are configured to collectively create a three-dimensional sensing field.

Example 116

The obscured feature detector of Example 109, further comprising a controller coupled to the sensing circuit, the controller being configured to analyze the sensor readings measured by the sensing circuit, wherein the controller is configured to set the indicator to indicate a location of a region of relative high sensor reading on one or more sensor plates of the three or more sensor plates.

Example 117

The obscured feature detector of Example 109, comprising a plurality of indicators to be toggled between a deactivated state and an activated state to indicate a location of a region of relative high sensor reading on the three or more sensor plates.

Example 118

The obscured feature detector of Example 109, wherein the sensor reading comprises a capacitance reading, wherein the sensing circuit senses the capacitance surrounding each sensor plate.

Example 119

The obscured feature detector of Example 109, wherein the sensor reading comprises an electromagnetic reading, wherein the sensing circuit senses an electromagnetic field surrounding each sensor plate.

Example 120

The obscured feature detector of Example 109, wherein the sensing circuit reads at least two of the three or more sensor plates simultaneously.

Example 121

The obscured feature detector of Example 109, wherein the three or more sensor plates are arranged in a square pattern.

Example 122

The obscured feature detector of Example 109, wherein all of the three or more sensor plates have a similar geometry.

Example 123

The obscured feature detector of Example 109, wherein each of the three or more sensor plates is arranged in a radially symmetrical pattern.

Example 124

The obscured feature detector of Example 109, wherein the three or more sensor plates are arranged in radial symmetry.

Example 125

The obscured feature detector of Example 109, wherein the three or more sensor plates are arranged in a radially symmetrical pattern.

Example 126

The obscured feature detector of Example 109, wherein each sensor plate of the three or more sensor plates has an internal border extending along at least a portion of an internal border of one or more other sensor plates of the three or more sensor plates and an external border disposed at an outer perimeter of the three or more sensor plates, wherein the external border of each sensor plate is similar in length to the external border of every other sensor plate of the three or more sensor plates.

Example 127

The obscured feature detector of Example 109, wherein each sensor plate is a combination of two or more mini sensor plates, wherein two or more mini sensor plates are sensed simultaneously.

Example 128

The obscured feature detector of Example 109, wherein one of the sensor plates is an active shield.

Example 129

An obscured feature detector comprising: three or more sensor plates each to take a sensor reading that varies based on a proximity of the sensor plate to one or more surrounding objects and on a material property of each of the one or more surrounding objects, the three or more sensor plates and an active shield collectively creating a sensing field, the three or more sensor plates positioned so that each individual sensor plate of the three or more sensor plates has a corresponding primary sensing field zone that is a geometric three-dimensional volume of the sensing field where the individual sensor plate contributes more strongly to the sensing field than the active shield or any other of the three or more sensor plates wherein the three or more sensor plates have primary sensing field zones that are geometrically similar.

Example 130

The obscured feature detector of Example 129, wherein the primary sensing field zones are to be geometrically similar when all of the three or more sensor plates are under equivalent electrical conditions.

Example 131

The obscured feature detector of Example 129, wherein the primary sensing field zones are to be geometrically similar when all of the three or more sensor plates are under the operating conditions of the detector.

Example 132

The obscured feature detector of Example 129, wherein the three or more sensor plates comprise eight sensor plates.

Example 133

The obscured feature detector of Example 129, wherein the three or more sensor plates comprise four sensor plates.

Example 134

The obscured feature detector of Example 129, further comprising an electrically conductive trace that forms an electrically conductive path between a sensor plate and the sensing circuit.

Example 135

The obscured feature detector of Example 129, wherein the three or more sensor plates are configured to collectively create a three-dimensional sensing field.

Example 136

The obscured feature detector of Example 129, further comprising a controller coupled to the sensing circuit, the controller being configured to analyze the sensor readings measured by the sensing circuit, wherein the controller is configured to set the indicator to indicate a location of a region of relative high sensor reading on one or more sensor plates of the three or more sensor plates.

Example 137

The obscured feature detector of Example 129, comprising a plurality of indicators to be toggled between a deactivated state and an activated state to indicate a location of a region of relative high sensor reading on the three or more sensor plates.

Example 138

The obscured feature detector of Example 129, wherein the sensor reading comprises a capacitance reading, wherein the sensing circuit senses the capacitance surrounding each sensor plate.

Example 139

The obscured feature detector of Example 129, wherein the sensor reading comprises an electromagnetic reading, wherein the sensing circuit senses an electromagnetic field surrounding each sensor plate.

Example 140

The obscured feature detector of Example 129, wherein the sensing circuit reads at least two of the three or more sensor plates simultaneously.

Example 141

The obscured feature detector of Example 129, wherein the three or more sensor plates are arranged in a square pattern.

Example 142

The obscured feature detector of Example 129, wherein all of the three or more sensor plates have a similar geometry.

Example 143

The obscured feature detector of Example 129, wherein each of the three or more sensor plates is arranged in a radially symmetrical pattern.

Example 144

The obscured feature detector of Example 129, wherein the three or more sensor plates are arranged in radial symmetry.

Example 145

The obscured feature detector of Example 129, wherein the three or more sensor plates are arranged in a radially symmetrical pattern.

Example 146

The obscured feature detector of Example 129, wherein each sensor plate of the three or more sensor plates has an internal border extending along at least a portion of an internal border of one or more other sensor plates of the three or more sensor plates and an external border disposed at an outer perimeter of the three or more sensor plates, wherein the external border of each sensor plate is similar in length to the external border of every other sensor plate of the three or more sensor plates.

Example 147

The obscured feature detector of Example 129, wherein each sensor plate is a combination of two or more mini sensor plates, wherein two or more mini sensor plates are sensed simultaneously.

Example 148

The obscured feature detector of Example 129, wherein one of the sensor plates is an active shield.

It will be obvious to those having skill in the art that many changes may be made to the details of the above-described embodiments without departing from the underlying principles of the invention. The scope of the present invention should, therefore, be determined only by the following claims.

The invention claimed is:

1. An obscured feature detector comprising:
    three or more sensor plates each to take a sensor reading that varies based on a proximity of the sensor plate to one or more surrounding objects and on a material property of each of the one or more surrounding objects, the three or more sensor plates to collectively create a sensing field, each individual sensor plate of the three or more sensor plates to create a corresponding primary sensing field zone within the sensing field where an individual sensor plate that creates the corresponding primary sensing field zone contributes more strongly to the sensing field in the corresponding primary sensing field zone than any other of the three or more sensor plates, wherein the three or more sensor plates are arranged in radial symmetry to create primary sensing field zones that are geometrically similar;
    a sensing circuit coupled to the three or more sensor plates, the circuit being configured to measure the sensor readings of the three or more sensor plates, wherein the sensor readings are based on the sensing field; and
    an indicator to be toggled between a deactivated state and an activated state to indicate a location of a region of relative high sensor reading.

2. The obscured feature detector of claim 1, wherein the primary sensing field zones are to be geometrically similar when all of the three or more sensor plates are under the operating conditions of the detector.

3. The obscured feature detector of claim 1, further comprising a controller coupled to the sensing circuit, the controller being configured to analyze the sensor readings measured by the sensing circuit,
    wherein the controller is configured to set the indicator to indicate a location of a region of relative high sensor reading on one or more sensor plates of the three or more sensor plates.

4. The obscured feature detector of claim 1, comprising a plurality of indicators to be toggled between a deactivated state and an activated state to indicate a location of a region of relative high sensor reading on the three or more sensor plates.

5. The obscured feature detector of claim 1, wherein the sensor reading comprises a capacitance reading,
    wherein the sensing circuit senses the capacitance surrounding each sensor plate.

6. The obscured feature detector of claim 1, wherein the sensing circuit reads at least two of the three or more sensor plates simultaneously.

7. The obscured feature detector of claim 1, wherein the three or more sensor plates are arranged in a square pattern.

8. The obscured feature detector of claim 1, wherein all of the three or more sensor plates have a similar geometry.

9. The obscured feature detector of claim 1, wherein each of the three or more sensor plates are arranged in a radially symmetrical pattern.

10. The obscured feature detector of claim 1, wherein each sensor plate of the three or more sensor plates has an internal border extending along at least a portion of an internal border of one or more other sensor plates of the three or more sensor plates and an external border disposed at an outer perimeter of the three or more sensor plates, wherein the external border of each sensor plate is similar in length to the external border of every other sensor plate of the three or more sensor plates.

11. An obscured feature detector comprising:
    a group of three or more sensor plates configured so that each sensor plate has an internal border extending along at least a portion of an internal border of one or more other sensor plates of the group and an external border disposed at an outer perimeter of the group, wherein the external border of each sensor plate is similar in length to the external border of every other sensor plate of the group of three or more sensor plates, each sensor plate to take a sensor reading that varies based on a proximity of the sensor plate to one or more surrounding objects and on a material property of each of the one or more surrounding objects,
    wherein the similar length to the external borders of the three or more sensor plates creates sensing field zones for each of the three or more sensor plates that are geometrically similar;
    a sensing circuit coupled to the group of three or more sensor plates, the circuit being configured to measure the sensor readings of the three or more sensor plates, wherein the sensor readings are based on the sensing field zones; and
    an indicator to be toggled between a deactivated state and an activated state to indicate a location of a region of relative high sensor reading.

12. The obscured feature detector of claim 11, further comprising a controller coupled to the sensing circuit, the controller being configured to analyze the sensor readings measured by the sensing circuit,
    wherein the controller is configured to activate the indicator to indicate a location of a region of relative high sensor reading.

13. The obscured feature detector of claim 11, comprising a plurality of indicators to be toggled between a deactivated state and an activated state to indicate a location of a region of relative high sensor reading on one or more of the three or more sensor plates.

14. The obscured feature detector of claim 11, wherein the sensor reading comprises a capacitance reading,
wherein the sensing circuit senses the capacitance surrounding each sensor plate.

15. The obscured feature detector of claim 11, wherein the sensor reading comprises an electromagnetic reading,
wherein the sensing circuit senses an electromagnetic field surrounding each sensor plate.

16. The obscured feature detector of claim 11, wherein the sensing circuit reads at least two of the three or more sensor plates simultaneously.

17. The obscured feature detector of claim 11, wherein each sensor plate is a combination of two or more mini sensor plates, wherein two or more mini sensor plates are sensed simultaneously.

18. The obscured feature detector of claim 11, wherein the three or more sensor plates all have substantially similar effective border lengths.

19. The obscured feature detector of claim 11, wherein the three or more sensor plates all have substantially similar internal border lengths.

20. The obscured feature detector of claim 11, wherein the three or more sensor plates all have substantially similar geometries.

21. The obscured feature detector of claim 11, wherein the three or more sensor plates all have similar internal border contours.

22. The obscured feature detector of claim 11, wherein the three or more sensor plates all have similar external border contours.

23. The obscured feature detector of claim 11, wherein the group of three or more sensor plates are arranged in a hexagonal pattern.

24. The obscured feature detector of claim 11, wherein the group of three or more sensor plates collectively create a three-dimensional sensing field, the three or more sensor plates positioned so that each individual sensor plate of the three or more sensor plates has a corresponding primary sensing field zone that is a geometric three-dimensional volume of the sensing field where an individual sensor plate that creates the corresponding primary sensing field zone contributes more strongly to the sensing field than any other of the three or more sensor plates, wherein the three or more sensor plates all have primary sensing field zones that are geometrically similar.

25. A method of detecting an obscured feature behind a surface, comprising:
taking a sensor reading of sensor plates of an obscured feature detector that is disposed in a stationary position on the surface, the obscured feature detector comprising three or more sensor plates, a sensing circuit, and an indicator, wherein the three or more sensor plates collectively create a sensing field, wherein the three or more sensor plates are configured so that each individual sensor plate of the three or more sensor plates has a corresponding primary sensing field zone that is a geometric three-dimensional volume of the sensing field where an individual sensor plate that creates the corresponding primary sensing field zone contributes more strongly to the sensing field than any other of the three or more sensor plates,
wherein the three or more sensor plates are arranged in radial symmetry to create primary sensing field zones that are geometrically similar;
measuring, via the sensing circuit, the sensor readings of the three or more sensor plates based on the sensing field;
comparing measured sensor readings in different regions of the sensing field; and
toggling the indicator from a deactivated state to an activated state to indicate a location of a region of relative high sensor reading.

26. The method of claim 25, wherein the three or more sensor plates and one active shield create the three-dimensional sensing field, wherein the active shield is driven with a signal that is similar to the signal on the sensor plates.

27. The method of claim 25, wherein the measured sensor reading is a capacitive reading.

28. The method of claim 25, wherein the measured sensor reading is an electromagnetic reading.

29. The method of claim 25, wherein each of the sensor plates has a similar geometry.

30. A method of detecting an obscured feature behind a surface, comprising:
taking a sensor reading of sensor plates of an obscured feature detector that is disposed in a stationary position on the surface, the obscured feature detector comprising a group of three or more sensor plates, a sensing circuit, and an indicator, wherein the group of three or more sensor plates are configured so that each sensor plate has an internal border extending along at least a portion of an internal border of one or more other sensor plates of the group and an external border disposed at an outer perimeter of the group, wherein the external border of each sensor plate is similar in length to the external border of every other sensor plate of the group of three or more sensor plates, each sensor plate to take a sensor reading that varies based on a proximity of the sensor plate to one or more surrounding objects and on a material property of each of the one or more surrounding objects,
wherein the similar length to the external borders of the three or more sensor plates creates sensing field zones for each of the three or more sensor plates that are geometrically similar;
measuring, via the sensing circuit, the sensor readings of the three or more sensor plates, wherein the sensor readings are based on the sensing field zones;
comparing measured sensor readings in different regions of the sensing field; and
toggling the indicator from a deactivated state to an activated state to indicate a location of a region of relative high sensor reading on the three or more sensor plates.

31. The method of claim 30, wherein the three sensor more plates and one active shield create the three-dimensional sensing field, wherein the active shield is driven with a signal that is similar to the signal on the sensor plates.

32. The method of claim 30, wherein the measured sensor reading is a capacitive reading.

33. The method of claim 30, wherein the measured sensor reading is an electromagnetic reading.

34. The method of claim 30, wherein each of the sensor plates has a similar geometry.

35. An obscured feature detector comprising:
three or more sensor plates each to take a sensor reading that varies based on a proximity of the sensor plate to one or more surrounding objects and on a material property of each of the one or more surrounding objects, the three or more sensor plates collectively creating a sensing field, the three or more sensor plates positioned so that each individual sensor plate of the three or more sensor plates has a corresponding primary sensing field zone that is a geometric three-dimensional volume of the sensing field where the individual sensor plate is able to sense effectively, wherein the three or more sensor plates are arranged in radial symmetry to create primary sensing field zones that are geometrically, and wherein each of the three or more sensor plates have similar sensing fields within their respective primary sensing field zones.

36. An obscured feature detector comprising:

three or more sensor plates each to take a sensor reading that varies based on a proximity of the sensor plate to one or more surrounding objects and on a material property of each of the one or more surrounding objects, the three or more sensor plates and an active shield collectively creating a sensing field, the three or more sensor plates positioned so that each individual sensor plate of the three or more sensor plates has a corresponding primary sensing field zone that is a geometric three-dimensional volume of the sensing field where an individual sensor that creates the corresponding primary sensing field zone contributes more strongly to the sensing field than the active shield or any other of the three or more sensor plates, wherein the three or more sensor plates are arranged in radial symmetry to create primary sensing field zones that are geometrically similar.

* * * * *

UNITED STATES PATENT AND TRADEMARK OFFICE
CERTIFICATE OF CORRECTION

PATENT NO.         : 10,261,208 B2
APPLICATION NO.    : 15/136570
DATED              : April 16, 2019
INVENTOR(S)        : David M. Dorrough Page 1 of 1

It is certified that error appears in the above-identified patent and that said Letters Patent is hereby corrected as shown below:

In the Claims

Column 46, Lines 54-55 read, ". . . three sensor more plates . . ." which should read, ". . . three or more sensor plates . . ."

Column 47, Line 8 reads, ". . . to sense effectively," which should read, ". . . to sense effectively"

Column 47, Line 11 reads, "that are geometrically, and . . ." which should read, "that are geometrically similar, and . . ."

Signed and Sealed this
Twelfth Day of November, 2019

Andrei Iancu
*Director of the United States Patent and Trademark Office*